(12) United States Patent
Yutani

(10) Patent No.: US 11,508,777 B2
(45) Date of Patent: Nov. 22, 2022

(54) INFRARED SOLID STATE IMAGING DEVICE

(71) Applicant: Mitsubishi Electric Corporation, Chiyoda-ku (JP)

(72) Inventor: Akie Yutani, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 84 days.

(21) Appl. No.: 16/969,830

(22) PCT Filed: Sep. 26, 2018

(86) PCT No.: PCT/JP2018/035622
§ 371 (c)(1),
(2) Date: Aug. 13, 2020

(87) PCT Pub. No.: WO2019/193777
PCT Pub. Date: Oct. 10, 2019

(65) Prior Publication Data
US 2020/0373347 A1 Nov. 26, 2020

(30) Foreign Application Priority Data
Apr. 4, 2018 (JP) .............................. JP2018-072489

(51) Int. Cl.
*H01L 27/146* (2006.01)
*H04N 5/33* (2006.01)
(Continued)

(52) U.S. Cl.
CPC .. *H01L 27/14649* (2013.01); *H01L 27/14679* (2013.01); *H04N 5/33* (2013.01)

(58) Field of Classification Search
None
See application file for complete search history.

(56) References Cited

U.S. PATENT DOCUMENTS

| 6,465,784 | B1 | 10/2002 | Kimata |
| 2002/0019021 | A1 | 12/2002 | Ishikawa et al. |
| 2009/0261445 | A1* | 10/2009 | Sugino .................. G01J 5/0853 |
| | | | 257/463 |

FOREIGN PATENT DOCUMENTS

| JP | 2002-148111 A | 5/2002 |
| JP | 2003-65842 A | 3/2003 |

(Continued)

OTHER PUBLICATIONS

Extended European Search Report dated Apr. 30, 2021 in European Application No. 18913256.6.

(Continued)

*Primary Examiner* — Hung Q Dang
(74) *Attorney, Agent, or Firm* — Xsensus LLP

(57) ABSTRACT

An infrared solid state imaging device includes: a first PN junction diode has a first shortest length that is a shortest length from a first junction surface to a second junction surface; a PN junction diode has a second shortest length that is a shortest length from the second junction surface to a third junction surface, the second shortest length being different from the first shortest length; an insulating film serving as an element isolation region which establishes electrical isolation between a first region of the first PN junction diode and a fourth region of the second PN junction diode, and so on; and a metal wire provided on a second region of the first PN junction diode and a third region of the second PN junction diode, wherein the first PN junction diode and the second PN junction diode are connected in series.

9 Claims, 10 Drawing Sheets

(51) Int. Cl.
*G01J 1/02* (2006.01)
*G01J 5/02* (2022.01)
*G01J 5/20* (2006.01)

(56) References Cited

FOREIGN PATENT DOCUMENTS

| | | |
|---|---|---|
| JP | 2009-265094 A | 11/2009 |
| WO | WO 99/31471 A1 | 6/1999 |

OTHER PUBLICATIONS

International Search Report dated Dec. 25, 2018 in PCT/JP2018/035622 filed Sep. 26, 2018, citing documents AB and AO-AQ therein, 2 pages.

* cited by examiner

INFRARED SOLID STATE IMAGING DEVICE

TECHNICAL FIELD

The present invention relates to an infrared solid state imaging device, and in particular to a thermal infrared solid state imaging device including PN junction diodes as an infrared detection element.

BACKGROUND ART

An infrared solid state imaging device including thermal infrared detection elements as pixels absorbs infrared rays, converts the infrared rays into heat, outputs a temperature change caused by the heat as an electrical signal, and detects the infrared rays. The infrared solid state imaging device including thermal infrared detection elements can be downsized because it does not require a refrigerator. In particular, attention is focused on a thermal infrared solid state imaging device that uses silicon PN junction diodes which can be manufactured by a conventional semiconductor manufacturing process as infrared detection elements, and detects a temperature change in the amount of a voltage drop in a forward direction thereof.

However, in the thermal infrared solid state imaging device which detects a temperature change in the amount of a voltage drop in the forward direction of the silicon PN junction diodes, the temperature change rate of a junction current in the forward direction is small, when compared with other infrared detection elements that adopt a method of detecting a temperature change in the resistance value of vanadium oxide, for example, and a sufficient sensitivity for detecting infrared rays cannot be obtained. Accordingly, an infrared solid state imaging device that improves sensitivity for detecting infrared rays by adopting a hollow structure that isolates a thermoelectric converter provided with silicon PN junction diodes from a substrate having a large heat capacity, or by connecting a plurality of silicon PN junction diodes in series, has been proposed.

In addition, an infrared solid state imaging device including infrared detection elements in which, in order to connect a plurality of silicon PN junction diodes in series, N type regions and P type regions of the silicon PN junction diodes are alternately placed to be in contact with one another, an electrode is provided between the regions of the adjacent silicon PN junction diodes, and thereby the plurality of silicon PN junction diodes are connected in series, has been proposed (see PTL 1, for example).

In addition, an infrared solid state imaging device including infrared detection elements in which, of a plurality of silicon PN junction diodes connected in series, at least some PN junction diodes have a bent shape for the purpose of placing as many PN junction diodes as possible in a limited area, has been proposed (see PTL 2, for example).

CITATION LIST

Patent Literature

PTL 1: Japanese Patent Laying-Open No. 2002-148111
PTL 2: Japanese Patent Laying-Open No. 2009-265094

SUMMARY OF INVENTION

Technical Problem

However, in such a conventional infrared detection element, a region in which the distance between adjacent PN junction surfaces is short is formed at a bent portion of a plurality of PN junction diodes connected in series.

In that case, electrons as minority carriers injected from an N type region into a P type region within a silicon PN junction diode are more likely to be injected into an N type region of an adjacent PN junction diode without recombination within the P type region, or holes as minority carriers injected from a P type region into an N type region within a silicon PN junction diode are more likely to be injected into a P type region of an adjacent PN junction diode without recombination within the N type region, which may cause an increase in the noise of the infrared detection element. In addition, since these regions tend to cause punch-through, the electrons in the N type region pass through the P type region and diffuse into the N type region of the adjacent PN junction diode, or the holes in the P type region pass through the N type region and diffuse into the P type region of the adjacent PN junction diode, which may also cause an increase in the noise of the infrared detection element.

Accordingly, the present invention has been made to solve the problem of conventional technology as described above, and an object thereof is to provide an infrared solid state imaging device that can reduce noise during detection of infrared rays.

Solution to Problem

In order to achieve the above object, an infrared solid state imaging device of the present invention is an infrared solid state imaging device including a first PN junction diode and a second PN junction diode connected in series that are provided to be thermally isolated from a substrate, the first PN junction diode and the second PN junction diode converting a temperature change caused by heat converted from emitted infrared rays into an electrical signal, the infrared solid state imaging device including: a first region having a first conductivity type; a second region having a second conductivity type which constitutes the first PN junction diode together with the first region, which is in contact with the first region at a first junction surface, and which has a first shortest length that is a shortest length from the first junction surface to a second junction surface; a third region having the first conductivity type which is in contact with the second region at the second junction surface, and which has a second shortest length that is a shortest length from the second junction surface to a third junction surface, the second shortest length being different from the first shortest length; a fourth region having the second conductivity type which constitutes the second PN junction diode together with the third region, and which is in contact with the third region at the third junction surface; an element isolation region which establishes electrical isolation between the first region and the fourth region, between the first region and the third region, and between the second region and the fourth region; and a metal wire provided on the second region and the third region for electrically connecting the first PN junction diode and the second PN junction diode in series.

Advantageous Effects of Invention

In the infrared solid state imaging device of the present invention configured as described above, the first shortest length is set to be different from the second shortest length, and the element isolation region is provided between the first region and the third region, and between the second region and the fourth region. Thereby, an infrared solid state imaging device that can reduce noise during detection of infrared rays can be provided.

DESCRIPTION OF EMBODIMENTS

Figure 1:
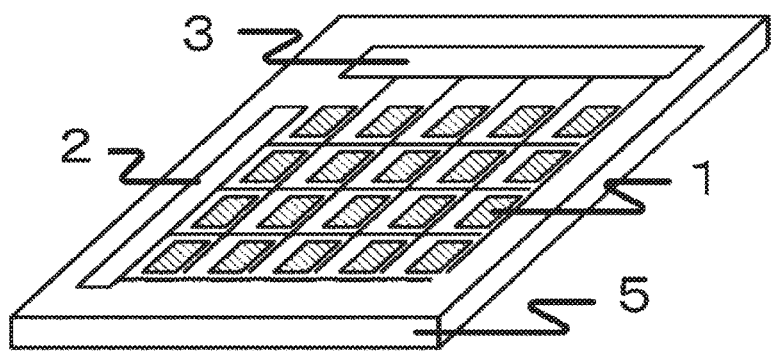
FIG. 1 is a perspective view showing a configuration of an infrared solid state imaging device as a first embodiment of the present invention.

First, a configuration of an infrared solid state imaging device of the present invention will be described with reference to the drawings. It should be noted that the drawings are schematic and are intended to conceptually describe a function or a structure. In addition, the present invention is not limited by embodiments described below. Unless otherwise described, the basic configuration of the infrared solid state imaging device is common in all the embodiments. Further, identical or corresponding parts will be designated by the same reference numerals, and this is common in the entire specification.

First Embodiment

First, a configuration of an infrared solid state imaging device as a first embodiment will be described. FIG. 1 is a perspective view showing a configuration of an infrared solid state imaging device as the present embodiment.

As shown in FIG. 1, an infrared solid state imaging device 100 as the present embodiment includes a substrate 5, a plurality of infrared detection elements 1 arranged as pixels in an array, a drive circuit 2 provided on substrate 5 for driving infrared detection elements 1 arranged in an array, and a signal processing circuit 3 provided on substrate 5 for processing electrical signals of infrared detection elements 1 driven by drive circuit 2.

In infrared solid state imaging device 100, as shown in FIG. 1, infrared detection elements 1 constitute a pixel array in which they are arranged in an array in two dimensions having four pixels in a vertical dimension and five pixels in a horizontal dimension, for example. However, the pixel array is not necessarily limited to having four pixels in the vertical dimension and five pixels in the horizontal dimension, and the number and arrangement of infrared detection elements 1 constituting the pixels of the pixel array can be adjusted as appropriate. Instead of the pixel array in which infrared detection elements 1 are arranged in two dimensions, a pixel array in which infrared detection elements 1 are arranged in one dimension may be adopted.

Figure 2:
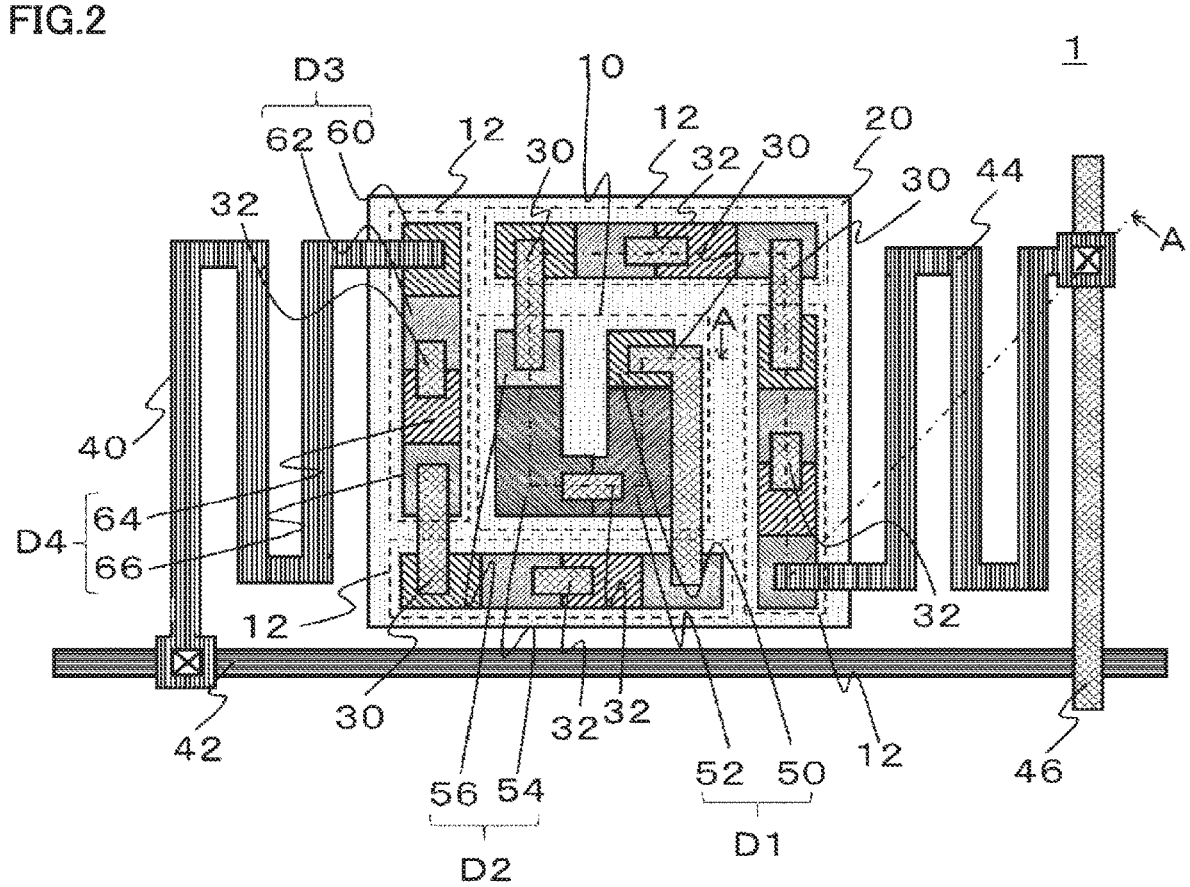
FIG. 2 is a plan view showing a configuration of an infrared detection element included in the first embodiment of the present invention.
Figure 3:
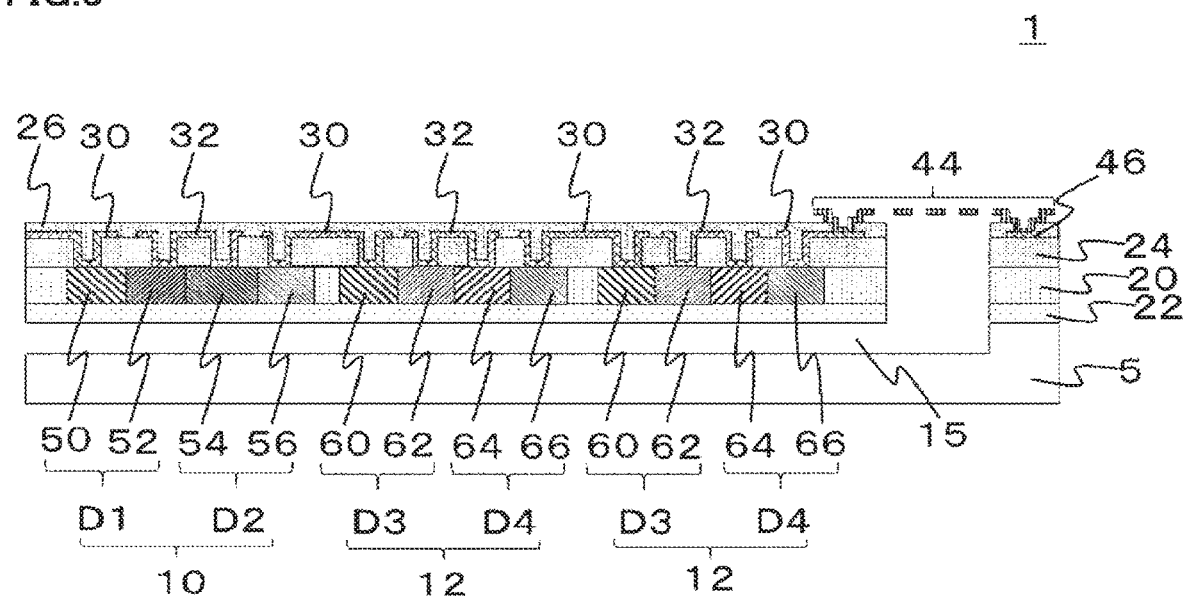
FIG. 3 is a cross sectional view showing the configuration of the infrared detection element included in the first embodiment of the present invention.

Next, a structure of infrared detection element 1 constituting one pixel within infrared solid state imaging device 100 as the present embodiment will be described using FIGS. 2 and 3. FIG. 2 is a plan view showing a configuration of infrared detection element 1 included in the present embodiment. FIG. 3 is a cross sectional view showing the configuration of infrared detection element 1 included in the present embodiment, and is a cross sectional view viewed along a cutting line A-A in FIG. 2.

As shown in FIG. 2, in infrared detection element 1 included in the present embodiment, a plurality of PN junction diodes, for example, 10 PN junction diodes in the present embodiment, are connected in series. Specifically, one PN junction diode group 10 and four PN junction diode groups 12 are arranged. PN junction diode group 10 includes two PN junction diodes D1 and D2 placed adjacently, and has a U shape. Each junction diode group 12 includes two PN junction diodes D3 and D4 placed adjacently, and has a linear shape.

PN junction diode group 10 and PN junction diode groups 12 are electrically isolated from one another by an insulating film 20 such as a silicon oxide film, for example, which serves as an element isolation region, as shown in FIGS. 2 and 3.

In addition, as shown in FIG. 3, infrared detection element 1 included in the present embodiment includes: substrate 5 made of a single crystal silicon substrate, for example; an insulating film 22 provided above substrate 5 with a space 15 being interposed therebetween, and made of a silicon oxide film, for example; PN junction diode group 10 having PN junction diodes D1 and D2 provided on insulating film 22; PN junction diode groups 12 each having PN junction diodes D3 and D4 provided on insulating film 22; and insulating film 20 provided on insulating film 22 for establishing electrical isolation between PN junction diode group 10 and the PN junction diode group 12, and between PN junction diode group 12 and PN junction diode group 12. That is, PN junction diode group 10 and PN junction diode groups 12 have a hollow structure having space 15 above substrate 5, and have a structure thermally isolated from substrate 5 having a large heat capacity.

PN junction diode group 10 and PN junction diode groups 12 are provided in semiconductor layers made of silicon layers, for example, as shown in FIG. 3. PN junction diode D1 of PN junction diode group 10 includes a P type region 50 and an N type region 52, which are placed adjacent to each other. PN junction diode D2 of PN junction diode group 10 includes a P type region 54 placed adjacent to N type region 52 of PN junction diode D1, and an N type region 56, which are placed adjacent to each other. PN junction diode D3 of PN junction diode group 12 includes a P type region 60 and an N type region 62, which are placed adjacent to each other. PN junction diode D4 of PN junction diode group 12 includes a P type region 64 placed adjacent to N type region 62 of PN junction diode D3, and an N type region 66, which are placed adjacent to each other. In addition, insulating film 20 establishes electrical isolation between N type region 56 and P type region 60, and between N type region 66 and P type region 60.

Further, as shown in FIGS. 2 and 3, metal wires 30 establish electrical connection between PN junction diode group 10 and PN junction diode groups 12 isolated by insulating film 20, such that they are connected in series.

Further, as shown in FIG. 2, metal wires 32 are provided on the regions described above, between PN junction diode D1 and PN junction diode D2 of PN junction diode group 10, and between PN junction diode D3 and PN junction diode D4 of each PN junction diode group 12. PN junction diode D1 and PN junction diode D2, and PN junction diode D3 and PN junction diode D4 are electrically connected by metal wires 32, and are connected in series.

Specifically, metal wires 30 and metal wires 32 are provided on an insulating film 24 made of a silicon oxide film, for example, and in contact holes provided in insulating film 24, as shown in FIG. 3. Metal wires 30 are provided on N type region 56 and P type region 60, and on N type region 66 and P type region 60, to establish electrical connection between N type region 56 and P type region 60, and between N type region 66 and P type region 60. In addition, metal wires 32 are provided on N type region 52 and P type region 54 of PN junction diode group 10, and on N type region 62 and P type region 64 of each PN junction diode group 12, to establish electrical connection therebetween.

Further, as shown in FIG. 2, of 10 PN junction diodes D1 to D4 connected in series, PN junction diode D3 provided at one end is electrically connected with a signal wire 40, and signal wire 40 is electrically connected to a drive signal wire 42 electrically connected with drive circuit 2. On the other hand, of 10 PN junction diodes D1 to D4 connected in series, PN junction diode D4 provided at the other end is electrically connected with a signal wire 44 via metal wire 30 as shown in FIGS. 2 and 3, and signal wire 44 is electrically connected to an output signal wire 46 electrically connected with signal processing circuit 3. That is, 10 PN junction diodes D1 to D4 are connected in series in order of D3, D4, D3, D4, D1, D2, D3, D4, D3, and D4 from signal wire 40, and reach signal wire 44.

Specifically, as shown in FIG. 3, signal wire 44 is provided on an insulating film 26 made of a silicon oxide film, for example, and in contact holes provided in insulating film 26, and is electrically connected, via metal wire 30, with N type region 66 of PN junction diode D4 at the other end, of 10 PN junction diodes D1 to D4 connected in series. Signal wire 44 is electrically connected from on insulating film 26, via space 15 above substrate 5, to output signal wire 46 provided on insulating film 24.

In addition, drive signal wire 42 extends in a row direction of the pixel array, and is electrically connected with signal wire 40 of another infrared detection element 1 placed in the same row direction within the pixel array. A plurality of drive signal wires 42 are provided for respective rows of the pixel array. Further, output signal wire 46 extends in a column direction of the pixel array, and is electrically connected with signal wire 44 of another infrared detection element 1 placed in the same column direction within the pixel array. A plurality of output signal wires 46 are provided for respective columns of the pixel array. That is, drive signal wire 42 and output signal wire 46 perpendicularly intersect with each other, and infrared detection element 1 is placed at a position where they intersect with each other.

Here, it is also possible to provide an infrared absorbing portion not shown, such as an infrared absorbing umbrella, for example, above PN junction diode group 10, PN junction diode groups 12, metal wires 30, and metal wires 32. When the infrared absorbing portion is provided, the infrared absorbing portion can absorb emitted infrared rays, convert the infrared rays into heat, and provide PN junction diode group 10 and PN junction diode groups 12 with a temperature change caused by the heat. In contrast, when the infrared absorbing portion is not provided, infrared detection element 1 itself absorbs emitted infrared rays and converts the infrared rays into heat, and a temperature change caused by the heat occurs in PN junction diode group 10 and PN junction diode groups 12.

Although the present embodiment herein describes only a cross sectional structure of a portion of infrared detection element 1 included in the present embodiment using FIG. 3, other linear-shaped PN junction diode groups 12 not shown in FIG. 3 also have the same cross sectional structure as that of PN junction diode groups 12 in FIG. 3. In addition, other metal wires 30, metal wires 32, and signal wire 40 not shown in FIG. 3 are also the same as metal wires 30, metal wires 32, and signal wire 44 in FIG. 3. Although drive signal wire 42 is different from output signal wire 46 in that it is provided in a layer different from that for output signal wire 46, drive signal wire 42 is the same as output signal wire 46 in that it is electrically connected with PN junction diode D3 at one end, of 10 PN junction diodes D1 to D4 connected in series, via metal wire 30 and signal wire 40.

Figure 4:
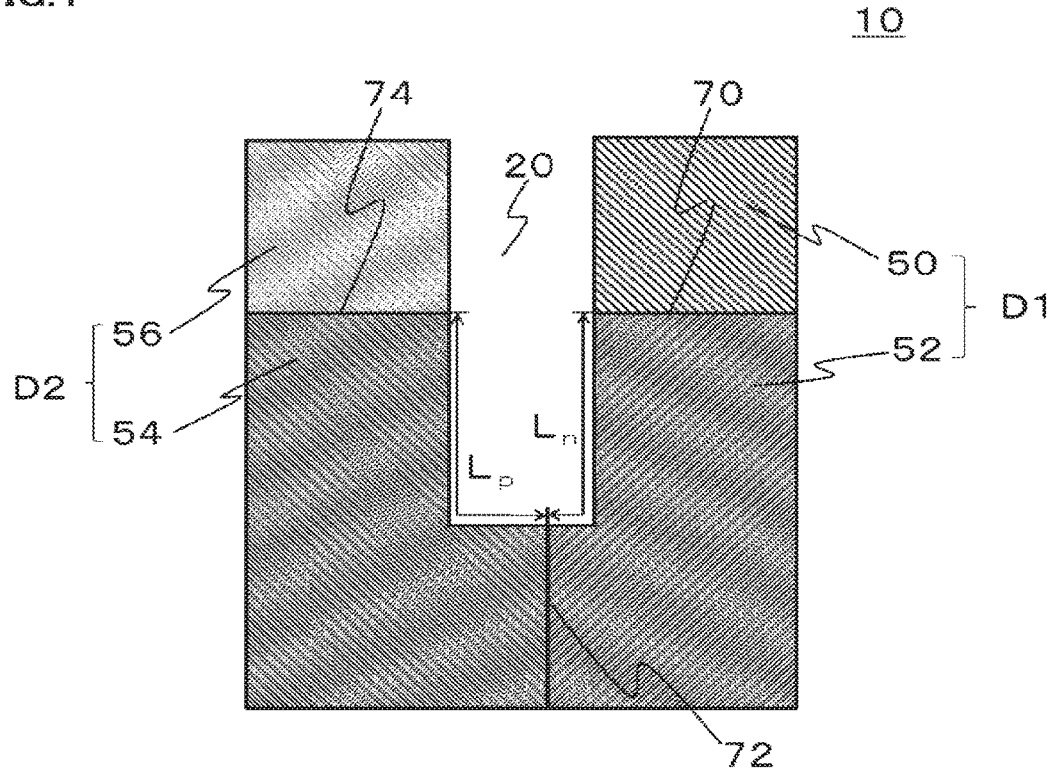
FIG. 4 is a plan view showing a configuration of a portion of the infrared detection element included in the first embodiment of the present invention.

Next, a specific configuration of infrared detection element 1 included in the present embodiment will be described. FIG. 4 is a plan view showing a configuration of a portion of infrared detection element 1 included in the present embodiment, and in particular a plan view showing a configuration of PN junction diode group 10 of infrared detection element 1 included in the present embodiment. Here, metal wires 30 and 32 provided on the regions shown in FIG. 2 are omitted and are not shown in FIG. 4, for easier description of the specific configuration of infrared detection element 1 in the present embodiment.

As shown in FIG. 4, PN junction diode group 10 includes PN junction diode D1 and PN junction diode D2 connected in series with each other. PN junction diode D1 includes P type region 50 and N type region 52 placed adjacent to P type region 50 at a junction surface 70, and PN junction diode D2 includes P type region 54 placed adjacent to N type region 52 of PN junction diode D1 at a junction surface 72 and N type region 56 placed adjacent to P type region 54 at a junction surface 74. In addition, when PN junction diode group 10 is used as infrared detection element 1, P type region 50 is connected to a high potential side, and N type region 56 is connected to a low potential side. That is, when PN junction diode group 10 operates as infrared detection element 1, junction surface 70 and junction surface 74 serve as junction surfaces for forward bias in which a forward current flows. That is, junction surface 70 functions as a PN junction of PN junction diode D1, and junction surface 74 functions as a PN junction of PN junction diode D2. On the other hand, at junction surface 72, N type region 52 of PN junction diode D1 is on the high potential side, P type region 54 of PN junction diode D2 is on the low potential side, and a depletion layer exists at an interface, unlike junction surface 70 and junction surface 74. However, since metal wire 32 for connecting these regions is provided on junction surface 72, a current flows mainly through metal wire 32.

P type region 50 and N type region 56 have a rectangular shape in plan view, and N type region 52 and P type region 54 have a bent shape in plan view, for example, an L shape in plan view. P type region 50, N type region 52, P type region 54, and N type region 56 are placed such that PN junction diode group 10 as a whole has a U shape in plan view.

Insulating film 20 is provided between P type region 50 and N type region 56, which are thereby electrically isolated from each other. In addition, insulating film 20 is provided to establish electrical isolation between junction surface 70 and junction surface 74, and is provided to reach one end of junction surface 72 in plan view. Accordingly, insulating film 20 establishes electrical isolation not only between P type region 50 and N type region 56, but also between P type region 50 and P type region 54, between N type region 52 and N type region 56, and between a portion of P type region 50 close to junction surface 70 and a portion of P type region 54 close to junction surface 74. That is, N type region 52 and P type region 54 are provided such that at least a portion of a line segment that connects an arbitrary point on junction surface 70 and an arbitrary point on junction surface 74 is within insulating film 20 serving as an element isolation region.

In addition, in infrared detection element 1 included in the present embodiment, a shortest length $L_n$ from junction surface 70 to junction surface 72 within N type region 52 is different from a shortest length $L_p$ from junction surface 72 to junction surface 74 within P type region 54. For example, as shown in FIG. 4, the length of N type region 52 along a boundary between N type region 52 and insulating film 20 is shortest length $L_n$ of N type region 52. Similarly, the length of P type region 54 along a boundary between P type region 54 and insulating film 20 is shortest length $L_p$ of P type region 54. For example, in the present embodiment, as shown in FIG. 4, shortest length $L_n$ from junction surface 70 to junction surface 72 within N type region 52 is shorter than shortest length $L_p$ from junction surface 72 to junction surface 74 within P type region 54.

Here, the shortest length described above refers to the length of a shortest path along which holes or electrons can pass through each region when the holes or the electrons injected from a region adjacent on one side pass through each region and reach a region adjacent on the other side. That is, in FIG. 4, since holes injected from P type region 50 cannot pass through insulating film 20, the shortest path along which the holes can pass through N type region 52 is a path along the boundary between insulating film 20 and N type region 52 from junction surface 70 with P type region 50 adjacent on one side to junction surface 72 with P type region 54 adjacent on the other side, and the path has the shortest length. Conversely, since electrons injected from N type region 56 cannot pass through insulating film 20, the shortest path along which the electrons can pass through P type region 54 is a path along the boundary between insulating film 20 and P type region 54 from junction surface 74 with N type region 56 adjacent on one side to junction surface 72 with N type region 52 adjacent on the other side, and the path has the shortest length.

Specifically, in the present embodiment, shortest length $L_n$ from junction surface 70 to junction surface 72 within N type region 52 and shortest length $L_p$ from junction surface 72 to junction surface 74 within P type region 54 are set to satisfy the following relation that is proportional to diffusion lengths of carriers. The details will be described later.

$$\frac{L_p}{L_n} = \sqrt{\frac{\mu_e \tau_e}{\mu_h \tau_h}} \qquad \text{[Expression 1]}$$

Here, $\mu_h$ is the mobility of the holes in N type region 52, and $\tau_h$ is a time constant of recombination of the holes as minority carriers injected into N type region 52 and electrons as majority carriers. In addition, $\mu_e$ is the mobility of the electrons in P type region 54, and $\tau_e$ is a time constant of recombination of the electrons as minority carriers injected into P type region 54 and holes as majority carriers.

Thus, infrared solid state imaging device 100 as the present embodiment having infrared detection elements 1 is configured.

Infrared solid state imaging device 100 as the present embodiment configured as described above passes a current through PN junction diodes D1 to D4 connected in series by applying a forward bias to PN junction diodes D1 to D4 connected in series within each infrared detection element 1 by drive circuit 2, and detects infrared rays by detecting an electrical signal corresponding to a change in current-voltage characteristics of PN junction diodes D1 to D4 connected in series by signal processing circuit 3. Specifically, when infrared rays are emitted to infrared solid state imaging device 100, heat converted from the infrared rays by the infrared absorbing portion or infrared detection element 1 itself is conducted to PN junction diodes D1 to D4 connected in series, and a temperature change occurs in PN junction diodes D1 to D4. When drive circuit 2 is a constant current source, the temperature change in PN junction diodes D1 to D4 causes a change in the amount of a voltage drop in a forward direction of PN junction diodes D1 to D4 connected in series. By detecting the change in the voltage drop in the forward direction as an electrical signal by signal processing circuit 3, infrared solid state imaging device 100 as the present embodiment can detect the infrared rays, and image an infrared image corresponding to the emitted infrared rays.

Although an example of detecting a change in the amount of a voltage drop in the forward direction of PN junction diodes D1 to D4 connected in series to a constant current source is herein described as a method for detecting a temperature change in PN junction diodes D1 to D4 connected in series, an optimal detection method can be selected as appropriate, such as applying a constant voltage to PN junction diodes D1 to D4 connected in series to detect a change in current value in the forward direction, for example.

Next, operation of infrared detection element 1 included in the present embodiment will be described in more detail.

When a bias voltage in the forward direction is applied to PN junction diode group 10, considering the holes injected into N type region 52, the holes are minority carriers in N type region 52, and thus they are recombined with a large number of electrons existing in N type region 52, and disappear at a certain time constant $\tau_h$. In addition, since the electric field is weak within N type region 52, movement of the holes follows a diffusion process. Therefore, when $D_h$ represents a diffusion factor, a diffusion length $L_h$ of the holes is provided as follows.

$$L_h = \sqrt{D_h \tau_h} \qquad \text{[Expression 2]}$$

Further, when k represents the Boltzmann's constant, T represents the temperature, and e represents an elementary charge, diffusion factor $D_h$ of the holes and mobility $\mu_h$ of the holes have the following relational expression according to the Einstein's relation.

$$\frac{D_h}{\mu_h} = \frac{kT}{e} \qquad \text{[Expression 3]}$$

Therefore, when the above relational expression is used, diffusion length $L_h$ of the holes is provided as follows.

$$L_h = \sqrt{\mu_h \tau_h kT/e} \qquad \text{[Expression 4]}$$

Similarly, when the bias voltage in the forward direction is applied to PN junction diode group 10, considering the electrons injected into P type region 54, the electrons are minority carriers in P type region 54, and thus they are recombined with a large number of holes existing in P type region 54, and disappear at a certain time constant $\tau_e$. In addition, since the electric field is weak within P type region 54, movement of the electrons follows the diffusion process. Therefore, as with the holes, a diffusion length $L_e$ of the electrons passing through a space charge region and injected into P type region 54 is provided as follows, where $\mu_e$ represents the mobility of the electrons.

$$L_e = \sqrt{\mu_e \tau_e kT/e} \qquad \text{[Equation 5]}$$

Thus, the following relation can be derived from diffusion length $L_h$ of the holes and diffusion length $L_e$ of the electrons described above.

$$\frac{L_e}{L_h} = \sqrt{\frac{\mu_e \tau_e}{\mu_h \tau_h}} \qquad \text{[Equation 6]}$$

This indicates a difference between diffusion distances of the electrons and the holes until recombination in the respective regions. For example, when it is assumed that mobility $\mu_e$ of the electrons is 1500 cm$^2$/Vs or less, mobility $\mu_h$ of the holes is 500 cm$^2$/Vs or less, and a recombination time $\tau_e$ of the electrons in the P type region and a recombination time $\tau_h$ of the holes in the N type region are $\tau_e$ to $\tau_h$, $L_e/L_h$ is 1.7 or less. That is, as to the diffusion distances of the electrons and the holes until recombination, the diffusion distance of the electrons injected into P type region 54 is 1.7 times longer than the diffusion distance of the holes injected into N type region 52.

That is, by setting shortest length $L_n$ from junction surface 70 to junction surface 72 within N type region 52 and shortest length $L_p$ from junction surface 72 to junction surface 74 within P type region 54 to have different values, for example, to satisfy $L_e/L_h$ of 1.7 or less, such that shortest length $L_n$ from junction surface 70 to junction surface 72 within N type region 52 and shortest length $L_p$ from junction surface 72 to junction surface 74 within P type region 54 satisfy the above relational expression, both the electrons and the holes can be efficiently recombined within the respective regions, within a limited dimension.

Next, the reason that noise can be reduced by recombination within each region will be described. When the holes as minority carriers injected from P type region 50 through junction surface 70 of PN junction diode D1 pass through junction surface 72 without recombination within N type region 52 and enter P type region 54 of PN junction diode D2, the holes diffuse through P type region 54 mainly by a concentration gradient because the holes are majority carriers in P type region 54, and reach junction surface 74 of PN junction diode D2. Further, the holes reaching junction surface 74 pass through junction surface 74 by a forward bias applied to junction surface 74 of PN junction diode D2, and reach N type region 56. However, since it is originally presumed that holes passing through junction surface 74 of PN junction diode D2 are generated only in P type region 54 and an amount thereof varies with a temperature change caused by incident infrared rays, these are excessive holes generated unintentionally, and generate a signal unrelated to the temperature.

In addition, since the above holes pass through junction surface 70 of PN junction diode D1 and are injected into P type region 54 of PN junction diode D2, they are more likely to flow close to the surface or close to an interface with a lower oxide film, when compared with the holes generated in P type region 54, and thus there is a high probability that they are trapped by a defect level or are reemitted. Both of such phenomena cause an increase in noise. Similarly, when the electrons as minority carriers injected from N type region 56 through junction surface 74 of PN junction diode D2 pass through junction surface 72 without recombination within P type region 54 and enter N type region 52 of PN junction diode D1, the electrons diffuse through N type region 52 mainly by a concentration gradient because the electrons are majority carriers in N type region 52, and reach junction surface 70 of PN junction diode D1. Further, the electrons reaching junction surface 70 pass through junction surface 70 by a forward bias applied to junction surface 70 of PN junction diode D1, and reach P type region 50.

However, since it is originally presumed that electrons passing through junction surface 70 of PN junction diode D1 are generated only in N type region 52 and an amount thereof varies with a temperature change caused by incident infrared rays, these are excessive electrons generated unintentionally, and generate a signal unrelated to the temperature. In addition, since the above electrons pass through junction surface 74 of PN junction diode D2 and are injected into N type region 52 of PN junction diode D1, they are more likely to flow close to the surface or close to an interface with a lower oxide film, when compared with the holes generated in N type region 52, and thus there is a high probability that they are trapped by a defect level or are reemitted. Both of such phenomena cause an increase in noise.

Here, as the path along which the holes or the electrons as minority carriers can move within each region becomes short, the holes or the electrons are more likely to enter an adjacent region from the junction surface between PN junction diode D1 and PN junction diode D2. That is, the holes or the electrons as minority carriers are most likely to enter an adjacent region from the junction surface between PN junction diode D1 and PN junction diode D2, at the shortest path to the junction surface between PN junction diode D1 and PN junction diode D2 within each region described above.

In addition, although this phenomenon occurs similarly for the holes and the electrons as minority carriers, the diffusion distance until recombination is different between the holes and the electrons, as described above. Accordingly, in the present embodiment, by setting shortest length $L_n$ within N type region 52 and shortest length $L_p$ within P type region 54 such that at least the lengths of the shortest paths within the respective regions satisfy the above relational expression, both the holes and the electrons are efficiently recombined within the respective entire regions. That is, by setting each shortest length according to the diffusion distance, and thereby achieving a balance between the probability at which the holes injected from P type region 50 into N type region 52 are recombined within N type region 52 and the probability at which the electrons injected from N type region 56 into P type region 54 are recombined within P type region 54, the probability of recombination as a whole can be maximized.

Therefore, the total amount of the electrons and the holes as minority carriers passing through junction surface 72 between PN junction diode D1 and PN junction diode D2 can be reduced, and a current component unrelated to the emitted infrared rays can be efficiently decreased. That is, an infrared detection element that reduces noise caused by the electrons or the holes as minority carriers passing through junction surface 72 between PN junction diode D1 and PN junction diode D2 can be provided.

In addition, since N type region 52 of PN junction diode D1 and P type region 54 of PN junction diode D2 have a bent shape, and insulating film 20 establishes electrical isolation between P type region 50 and P type region 54, between N type region 52 and N type region 56, and between a portion of N type region 52 close to junction surface 70 and a portion of P type region 54 close to junction surface 74 as described above, lengths of shortest length $L_n$ in N type region 52 and shortest length $L_p$ in P type region 54 can be set to sufficient lengths to suppress punch-through, within a limited dimension. Accordingly, the infrared solid state imaging device as the present embodiment can enhance reliability by suppressing punch-through, and can further downsize the infrared detection elements.

Thus, by the present embodiment configured as described above, an infrared solid state imaging device that can downsize infrared detection elements and that reduces noise can be provided.

Although the present embodiment herein describes that the above effect can be achieved when shortest length $L_n$ from junction surface 70 to junction surface 72 within N type region 52 and shortest length $L_p$ from junction surface 72 to junction surface 74 within P type region 54 satisfy the above relational expression, it is needless to say that the same effect can be achieved by setting shortest length $L_n$ within N type region 52 and shortest length $L_p$ within P type region 54 to be close to the above relational expression as much as possible.

Although the present embodiment herein provides the description using only the relation between shortest length $L_n$ from junction surface 70 to junction surface 72 within N type region 52 and shortest length $L_p$ from junction surface 72 to junction surface 74 within P type region 54, the shape of N type region 52 and P type region 54 can also be defined such that not only shortest length $L_n$ within N type region 52 and shortest length $L_p$ within P type region 54, but also the ratios of the lengths to a certain electric line force satisfy the above relational expression.

Although the present embodiment herein describes an example where metal wire 32 is provided on the regions, a recess may be provided in an N type region and a P type region to straddle the N type region and the P type region, and an embedded electrode may be provided to be embedded in the recess.

Figure 5:
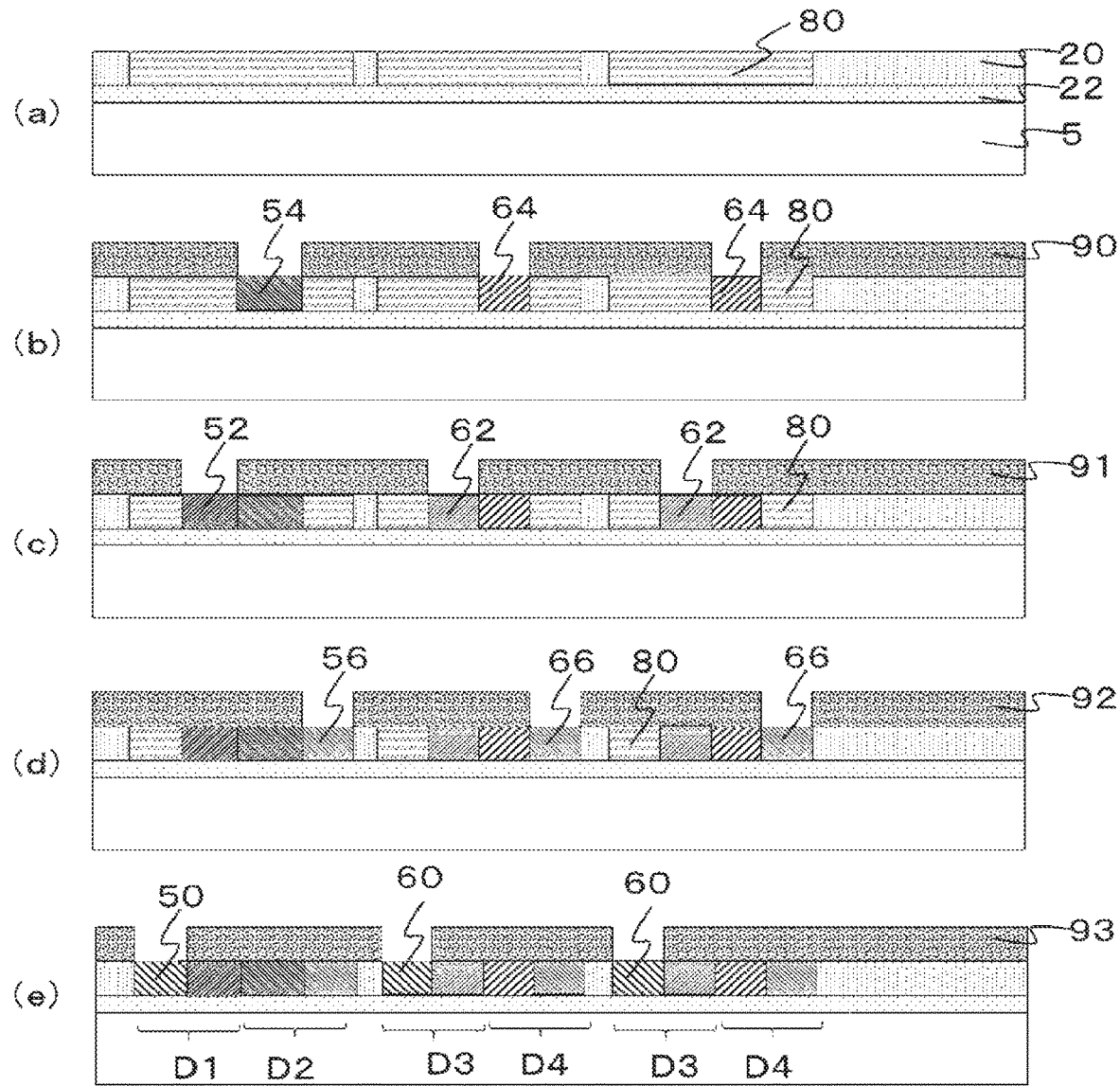
FIG. 5 is a cross sectional view showing the steps of forming respective conductivity type regions, of a method for manufacturing the infrared detection element included in the first embodiment of the present invention.
Figure 6:
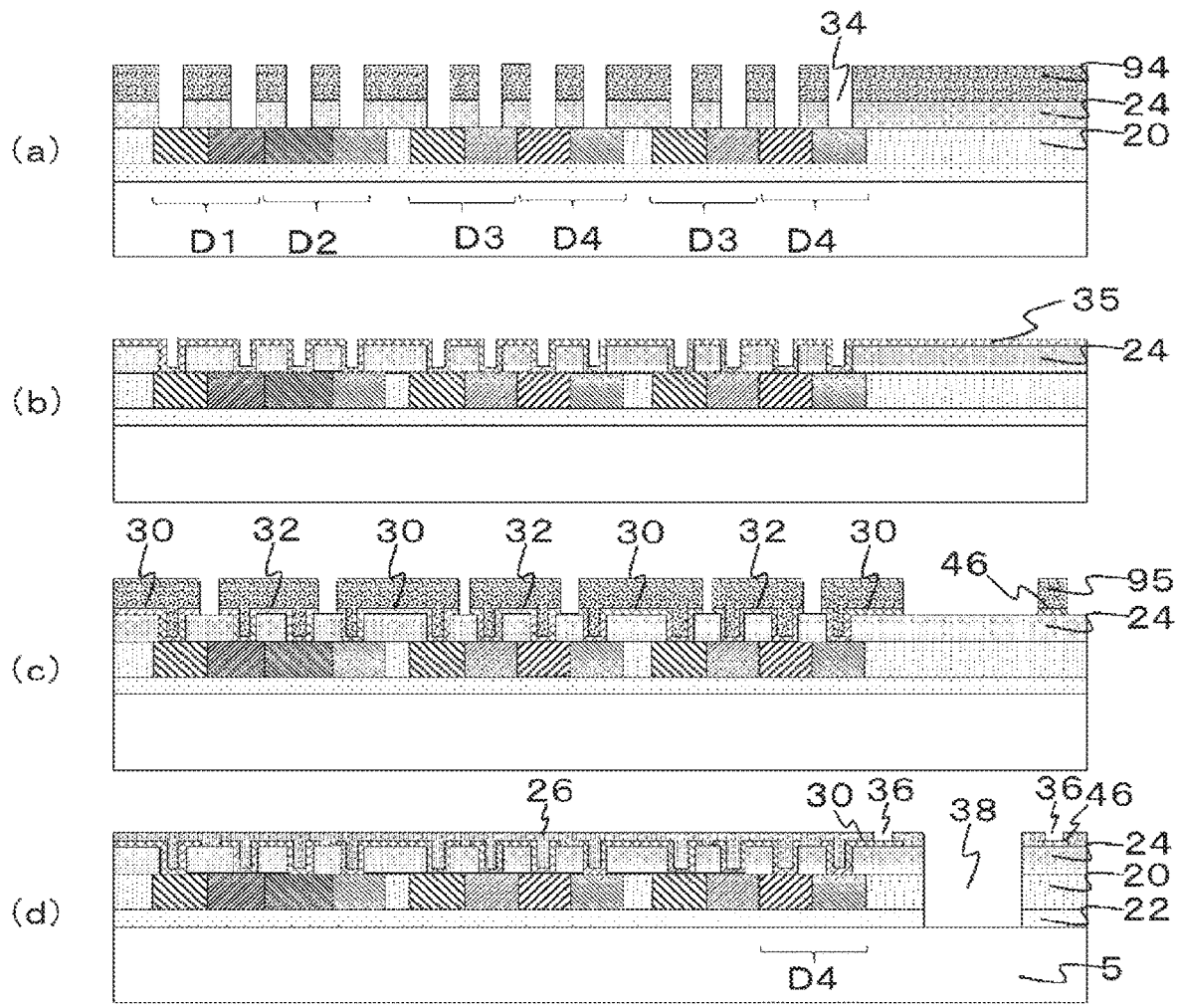
FIG. 6 is a cross sectional view showing the first-half steps of forming wires, of the method for manufacturing the infrared detection element included in the first embodiment of the present invention.
Figure 7:
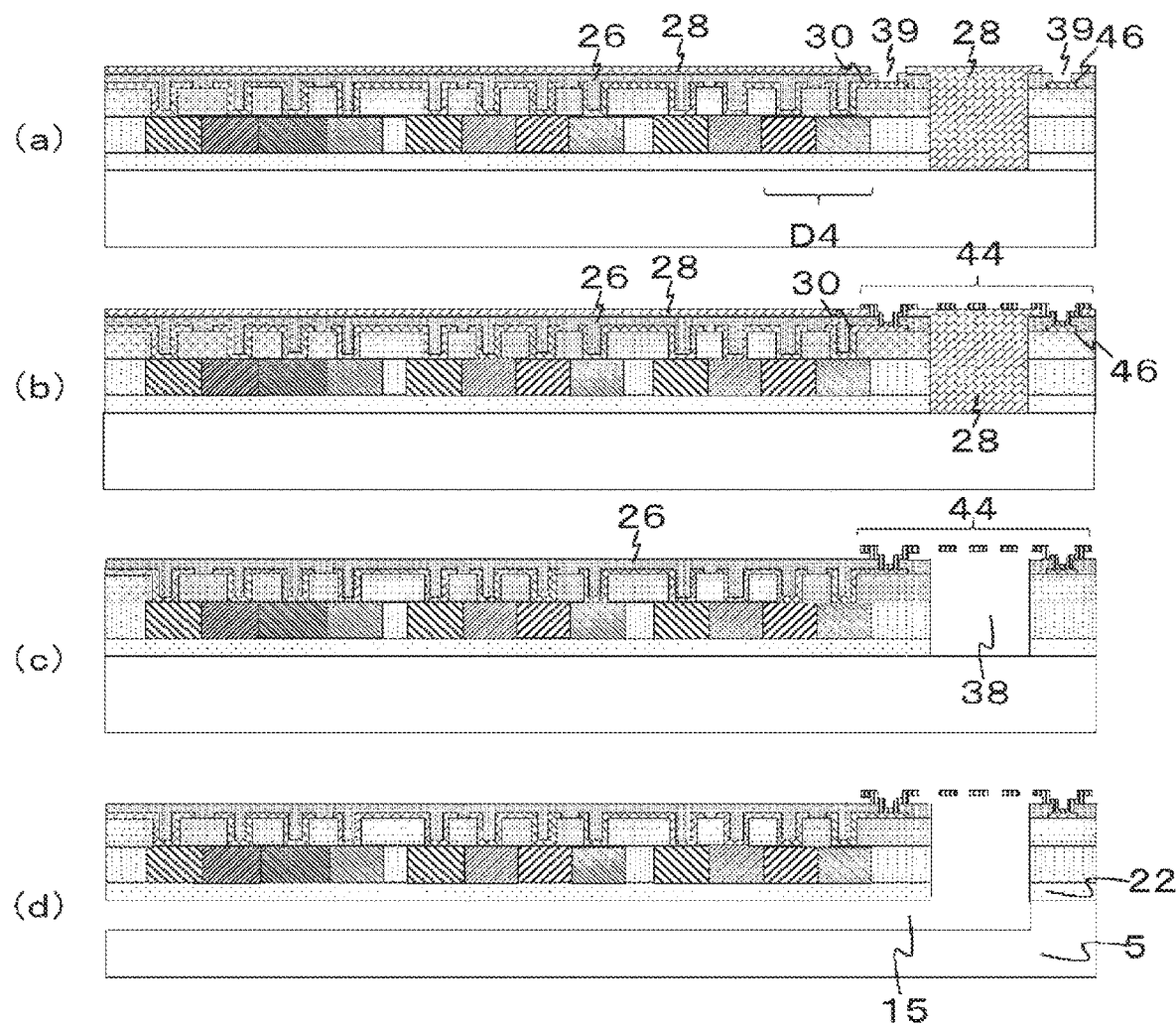
FIG. 7 is a cross sectional view showing the second-half steps of forming wires and the steps of forming a hollow structure, of the method for manufacturing the infrared detection element included in the first embodiment of the present invention.

Next, a method for manufacturing infrared detection element 1 included in the present embodiment will be described. FIG. 5 is a cross sectional view showing the steps of forming the P type regions and the N type regions, of the method for manufacturing infrared detection element 1 included in the present embodiment. FIG. 6 is a cross sectional view showing the first-half steps of forming wires, of the method for manufacturing infrared detection element 1 included in the present embodiment. FIG. 7 is a cross sectional view showing the second-half steps of forming wires and the steps of forming a hollow structure, of the method for manufacturing infrared detection element 1 included in the present embodiment.

First, as shown in FIG. 5(a), a silicon-on-insulator (SOI) substrate is prepared. The SOI substrate has substrate 5 made of a single crystal silicon substrate, for example, embedded insulating film 22 made of a silicon oxide film, for example, formed on substrate 5, and semiconductor layers 80 made of silicon layers formed on embedded insulating film 22.

Thereafter, insulating film 20 made of a silicon oxide film, for example, for establishing insulation between semiconductor layers 80 for forming PN junction diodes is formed using a local-oxidation-of-silicon (LOCOS) isolation method or a shallow trench isolation (STI) method, for example.

Then, as shown in FIG. 5(b), a photoresist pattern 90 is formed. Photoresist pattern 90 has openings at regions for forming P type region 54 of PN junction diode D2 and P type regions 64 of PN junction diodes D4. Thereafter, P type impurity ions are implanted into semiconductor layers 80 using an ion implantation method, by using photoresist pattern 90 as a mask, and thereby P type region 54 and P type regions 64 are formed.

Subsequently, as shown in FIG. 5(c), a photoresist pattern 91 is formed. Photoresist pattern 91 has openings at regions for forming N type region 52 of PN junction diode D1 and N type regions 62 of PN junction diodes D3. Thereafter, N type impurity ions are implanted into semiconductor layers 80 using the ion implantation method, by using photoresist pattern 91 as a mask, and thereby N type region 52 and N type regions 62 are formed.

Subsequently, as shown in FIG. 5(d), a photoresist pattern 92 is formed. Photoresist pattern 92 has openings at regions for forming N type region 56 of PN junction diode D2 and N type regions 66 of PN junction diodes D4. Thereafter, N type impurity ions are implanted into semiconductor layers 80 using the ion implantation method, by using photoresist pattern 92 as a mask, and thereby N type region 56 and N type regions 66 are formed.

Then, as shown in FIG. 5(e), a photoresist pattern 93 is formed. Photoresist pattern 93 has openings at regions for forming P type region 50 of PN junction diode D1 and P type regions 60 of PN junction diodes D3. Thereafter, P type impurity ions are implanted into semiconductor layers 80 using the ion implantation method, by using photoresist pattern 93 as a mask, and thereby P type region 50 and P type regions 60 are formed.

Thus, the conductive regions of PN junction diodes D1 to D4 are formed.

Here, although the regions of PN junction diodes D1 to D4 are formed by different ion implantation steps, when regions having the same conductivity type and the same impurity concentration are formed for example, the regions may be formed simultaneously by the same ion implantation step. In addition, although the regions of PN junction diodes D1 to D4 are formed by the same ion implantation step, when regions having different impurity concentrations are formed, the regions may be formed separately by different ion implantation steps. Further, the order of forming the regions of PN junction diodes D1 to D4 can also be changed as appropriate.

Subsequently, as shown in FIG. 6(a), insulating film 24 made of a silicon oxide film, for example, is formed on PN junction diodes D1 to D4 and insulating film 20, and a photoresist pattern 94 having openings is formed on insulating film 24 in order to form contact holes 34 in insulating film 24. Thereafter, insulating film 24 is removed by etching, until upper surfaces of the respective conductivity type regions of PN junction diodes D1 to D4 are exposed, by using photoresist pattern 94 as a mask, and thereby contact holes 34 are formed.

Here, after contact holes 34 are formed, impurity ions having a high concentration may be implanted into the respective conductivity type regions by self-alignment using contact holes 34, in order to reduce contact resistance between the respective conductivity type regions of PN junction diodes D1 to D4 and metal wires 30 and 32.

Subsequently, as shown in FIG. 6(b), photoresist pattern 94 is removed, and a metal film 35 is formed on insulating film 24 and in contact holes 34.

Subsequently, as shown in FIG. 6(c), a photoresist pattern 95 having openings is formed on insulating film 24. Thereafter, portions of metal film 35 are removed by etching, by using photoresist pattern 95 as a mask, and thereby metal wires 30 and 32 and output signal wire 46 are formed on an upper surface of insulating film 24. Here, although not shown, drive signal wire 42 is also formed at this timing.

Subsequently, as shown in FIG. 6(d), photoresist pattern 95 is removed, and insulating film 26 made of a silicon oxide film, for example, is formed on insulating film 24 and on metal wires 30 and 32. Thereafter, insulating film 26 is etched such that a portion of an upper surface of metal wire 30 electrically connected with PN junction diode D4 at the other end, of PN junction diodes D1 to D4, and a portion of an upper surface of output signal wire 46 are exposed, and thereby openings 36 are formed. Further, insulating film 26, insulating film 24, insulating film 20, and insulating film 22 are etched in order, and thereby an opening 38 in which substrate 5 is exposed is formed between a region where PN junction diodes D1 to D4 are formed and a region where output signal wire 46 is formed. Here, although not shown, another opening is also formed at this timing between the region where PN junction diodes D1 to D4 are formed and a region where drive signal wire 42 is formed.

Subsequently, as shown in FIG. 7(a), a sacrificial film 28 made of an organic film such as polyimide, for example, is formed on insulating film 26 and in opening 38. Thereafter, sacrificial film 28 is etched such that a portion of the upper surface of metal wire 30 electrically connected with PN junction diode D4 at the other end, of 10 PN junction diodes D1 to D4 connected in series, and a portion of the upper surface of output signal wire 46 are exposed, and thereby openings 39 are formed.

Then, as shown in FIG. 7(b), a metal film is formed on sacrificial film 28 and in openings 39, and an unnecessary metal film is removed by etching, and thereby signal wire 44 is formed, which electrically connects output signal wire 46 and metal wire 30 electrically connected with PN junction diode D4 at the other end, of 10 PN junction diodes D1 to D4 connected in series. Here, although not shown, signal wire 40 is also formed at this timing, which electrically connects drive signal wire 42 and metal wire 30 electrically connected with PN junction diode D3 at one end, of 10 PN junction diodes D1 to D4 connected in series.

Subsequently, as shown in FIG. 7(c), sacrificial film 28 formed on insulating film 26 and in opening 38 is removed by a method such as ashing, for example.

Then, as shown in FIG. 7(d), substrate 5 on a back side of embedded insulating film 22 is removed using a gas or a liquid having a low reactivity with the metal film and a high reactivity with substrate 5, for example, a solution of an alkali such as tetramethylammonium hydroxide, and thereby a hollow structure having space 15 is formed. Thereby, 10 PN junction diodes D1 to D4 connected in series are thermally isolated from substrate 5 having a large heat capacity.

Thus, infrared detection element 1 included in the present embodiment can be manufactured.

Here, although the details are omitted, when infrared solid state imaging device 100 is manufactured, it is necessary to form drive circuit 2 and signal processing circuit 3, in addition to the method for manufacturing infrared detection element 1 described above. Drive circuit 2 and signal processing circuit 3 are formed using conventional semiconductor manufacturing technology, separately from the method for manufacturing the infrared detection element described above.

In addition, although the details are omitted, after the method for manufacturing infrared detection element 1 described above, an infrared absorbing portion not shown, such as an infrared absorbing umbrella, for example, may be formed above PN junction diode group 10, PN junction diode groups 12, metal wires 30, and metal wires 32.

Thus, by the present embodiment configured as described above, an infrared solid state imaging device that can downsize infrared detection elements and that reduces noise can be provided.

Although the present embodiment herein describes the infrared detection element including 10 PN junction diodes connected in series as an example, the present embodiment is not necessarily limited thereto, and the number of PN junction diodes connected in series can be adjusted as appropriate. In addition, the number and placement of PN junction diode group 10 and PN junction diode groups 12 can also be adjusted as appropriate, and it is only necessary to have at least one PN junction diode group 10 having a U shape, for example.

Second Embodiment

In an infrared detection element of an infrared solid state imaging device as a second embodiment, the direction in which a P type region 54a of a PN junction diode D2a is bent is different from that in the infrared detection element in the first embodiment. Since parts designated by the same reference numerals are configured in the same manner as those in the infrared detection element in the first embodiment, the description thereof is omitted.

Figure 8:
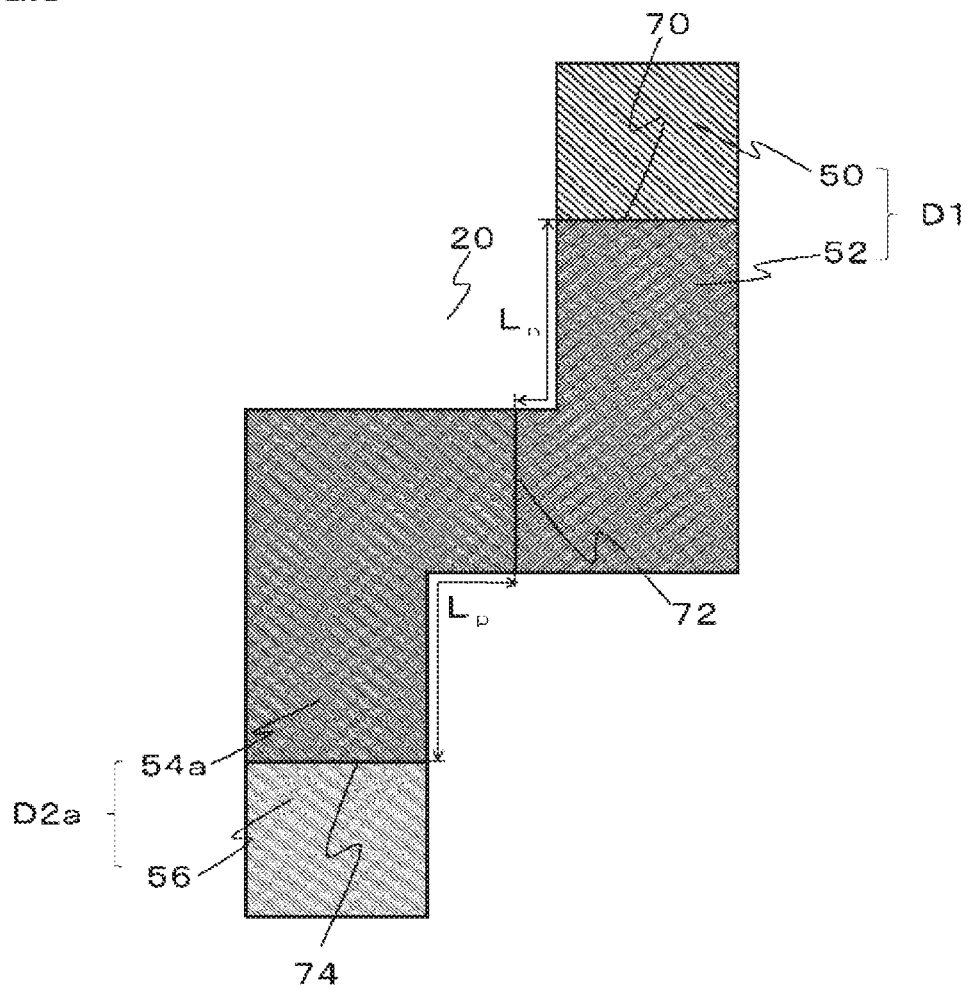
FIG. 8 is a plan view showing a configuration of a portion of an infrared detection element of an infrared solid state imaging device as a second embodiment of the present invention.

FIG. 8 is a plan view showing a configuration of a portion of the infrared detection element of the infrared solid state imaging device as the present embodiment, and is a plan view showing another configuration of PN junction diode group 10 of the infrared detection element in FIG. 2. As in the first embodiment, metal wires 30 and 32 provided on the regions are omitted and are not shown in FIG. 8.

As shown in FIG. 8, the infrared detection element included in the present embodiment includes PN junction diode D1 and PN junction diode D2a connected in series with each other. As in the first embodiment, PN junction diode D1 includes P type region 50 and N type region 52 having a bent shape placed adjacent to P type region 50 at junction surface 70. PN junction diode D2a includes P type region 54a having a bent shape placed adjacent to N type region 52 of PN junction diode D1 at junction surface 72, and N type region 56 placed adjacent to P type region 54a at junction surface 74. Unlike the first embodiment, P type region 54a is bent in a direction opposite to the direction in which N type region 52 is bent. Therefore, P type region 50, N type region 52, P type region 54a, and N type region 56 are placed such that PN junction diode group 10 as a whole has a crank shape.

Accordingly, shortest length $L_p$ from junction surface 72 to junction surface 74 within P type region 54a is the length of a path along a boundary between P type region 54a and insulating film 20, as shown in FIG. 8. While the relation between shortest length $L_n$ from junction surface 70 to junction surface 72 within N type region 52 and shortest length $L_p$ from junction surface 72 to junction surface 74 within P type region 54 is the same as that in the first embodiment and thus the description thereof is omitted, the same effect as that in the first embodiment is achieved. By the present embodiment, an infrared solid state imaging element that reduces noise can be provided.

Third Embodiment

In an infrared detection element of an infrared solid state imaging device as a third embodiment, a P type region 54b of a PN junction diode D2b has a rectangular shape, unlike the infrared detection element in the first embodiment. Since parts designated by the same reference numerals are configured in the same manner as those in the infrared detection element in the first embodiment, the description thereof is omitted.

Figure 9:
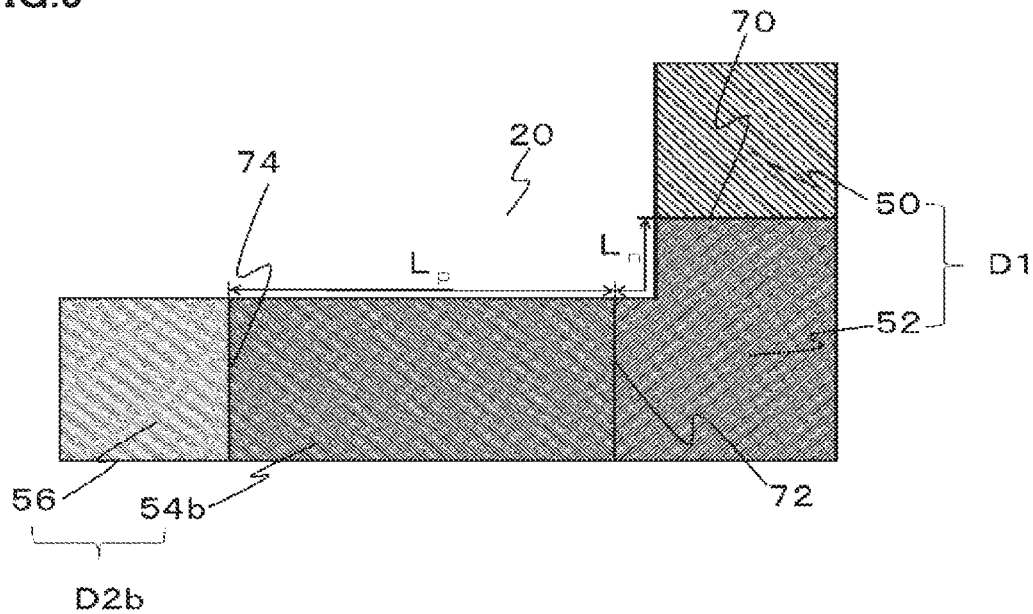
FIG. 9 is a plan view showing a configuration of a portion of an infrared detection element of an infrared solid state imaging device as a third embodiment of the present invention.

FIG. 9 is a plan view showing a configuration of a portion of the infrared detection element of the infrared solid state imaging device as the present embodiment, and is a plan view showing another configuration of PN junction diode group 10 of the infrared detection element in FIG. 2. As in the first embodiment, metal wires 30 and 32 provided on the regions are omitted and are not shown in FIG. 9.

As shown in FIG. 9, the infrared detection element included in the present embodiment includes PN junction diode D1 and PN junction diode D2b connected in series with each other. As in the first embodiment, PN junction diode D1 includes P type region 50 and N type region 52 having a bent shape placed adjacent to P type region 50 at junction surface 70. PN junction diode D2b includes P type region 54b having a rectangular shape placed adjacent to N type region 52 of PN junction diode D1 at junction surface 72, and N type region 56 placed adjacent to P type region 54b at junction surface 74. Unlike the first embodiment, P type region 54b has a rectangular shape, is adjacent to N type region 52 at one short side to form junction surface 72, and is adjacent to N type region 56 at the other opposite short side to form junction surface 74. Therefore, P type region 50, N type region 52, P type region 54b, and N type region 56 are placed such that PN junction diode group 10 as a whole has an L shape.

Accordingly, shortest length $L_p$ from junction surface 72 to junction surface 74 within P type region 54b is the length of the long side of P type region 54b, as shown in FIG. 9. While the relation between shortest length $L_n$ from junction surface 70 to junction surface 72 within N type region 52 and shortest length $L_p$ from junction surface 72 to junction surface 74 within P type region 54 is the same as that in the first embodiment and thus the description thereof is omitted, the same effect as that in the first embodiment is achieved. Noise is reduced in the infrared detection element included in the present embodiment, and a reliable infrared detection element can be provided.

In addition, since P type region 50, N type region 52, P type region 54b, and N type region 56 are placed such that the PN junction diode group as a whole has an L shape, the degree of freedom of placement of the PN junction diodes can be increased by combining the PN junction diode group 10 in the first embodiment with the PN junction diode groups of the infrared detection element included in the present embodiment, for example by providing them at four corners of a region for forming PN junction diodes, instead of PN junction diode groups 12 in FIG. 2. Thereby, the degree of freedom of design of the infrared detection element can be increased.

Thus, by the present embodiment configured as described above, an infrared solid state imaging device that reduces noise can be provided. In addition, an infrared solid state imaging device that can increase the degree of freedom of placement of PN junction diodes and that has a high degree of freedom of design of an infrared detection element can be provided.

Fourth Embodiment

In an infrared detection element of an infrared solid state imaging device as a fourth embodiment, an N type region 52a of a PN junction diode D1a has a rectangular shape, unlike the infrared detection element in the first embodiment. Since parts designated by the same reference numerals are configured in the same manner as those in the infrared detection element in the first embodiment, the description thereof is omitted.

Figure 10:
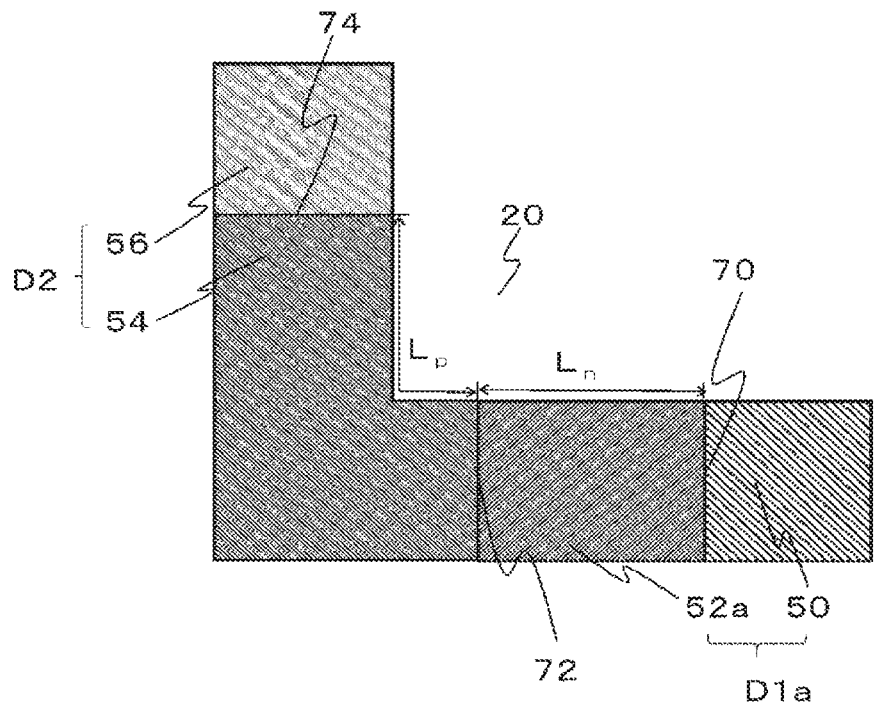
FIG. 10 is a plan view showing a configuration of a portion of an infrared detection element of an infrared solid state imaging device as a fourth embodiment of the present invention.

FIG. 10 is a plan view showing a configuration of a portion of the infrared detection element of the infrared solid state imaging device as the present embodiment, and is a plan view showing another configuration of PN junction diode group 10 in FIG. 2. As in the first embodiment, metal wires 30 and 32 provided on the regions are omitted and are not shown in FIG. 10.

As shown in FIG. 10, the infrared detection element included in the present embodiment includes PN junction diode D1a and PN junction diode D2 connected in series with each other. PN junction diode D1a includes P type region 50 and N type region 52a having a rectangular shape placed adjacent to P type region 50 at junction surface 70. Unlike the first embodiment, N type region 52a has a rectangular shape, is adjacent to P type region 50 at one short side to form junction surface 70, and is adjacent to P type region 54 at the other opposite short side to form junction surface 72. As in the first embodiment, PN junction diode D2 includes P type region 54 having a bent shape placed adjacent to N type region 52a of PN junction diode D1a at junction surface 72, and N type region 56 placed adjacent to P type region 54 at junction surface 74. Therefore, P type region 50, N type region 52a, P type region 54, and N type region 56 are placed such that PN junction diode group 10 as a whole has an L shape.

Accordingly, shortest length $L_n$ from junction surface 70 to junction surface 72 within N type region 52a is the length of the long side of N type region 52a from junction surface 70 to junction surface 72, as shown in FIG. 10. While the relation between shortest length $L_n$ from junction surface 70 to junction surface 72 within N type region 52a and shortest length $L_p$ from junction surface 72 to junction surface 74 within P type region 54 is the same as that in the first embodiment and thus the description thereof is omitted, the same effect as that in the first embodiment is achieved. By the infrared detection element included in the present embodiment, an infrared detection element that reduces noise can be provided.

In addition, since the effect of placing P type region 50, N type region 52a, P type region 54, and N type region 56 such that the PN junction diode group as a whole has an L shape is the same as that in the third embodiment, the description thereof is omitted.

Thus, by the present embodiment configured as described above, an infrared solid state imaging device that reduces noise can be provided. In addition, an infrared solid state imaging device that can increase the degree of freedom of placement of PN junction diodes and that has a high degree of freedom of design of an infrared detection element can be provided.

Fifth Embodiment

In an infrared detection element of an infrared solid state imaging device as a fifth embodiment, an N type region 52c having a high concentration is provided at a junction surface between a PN junction diode D1b and PN junction diode D2, unlike the infrared detection element in the first embodiment. Since parts designated by the same reference numerals are configured in the same manner as those in the infrared detection element in the first embodiment, the description thereof is omitted.

Figure 11:
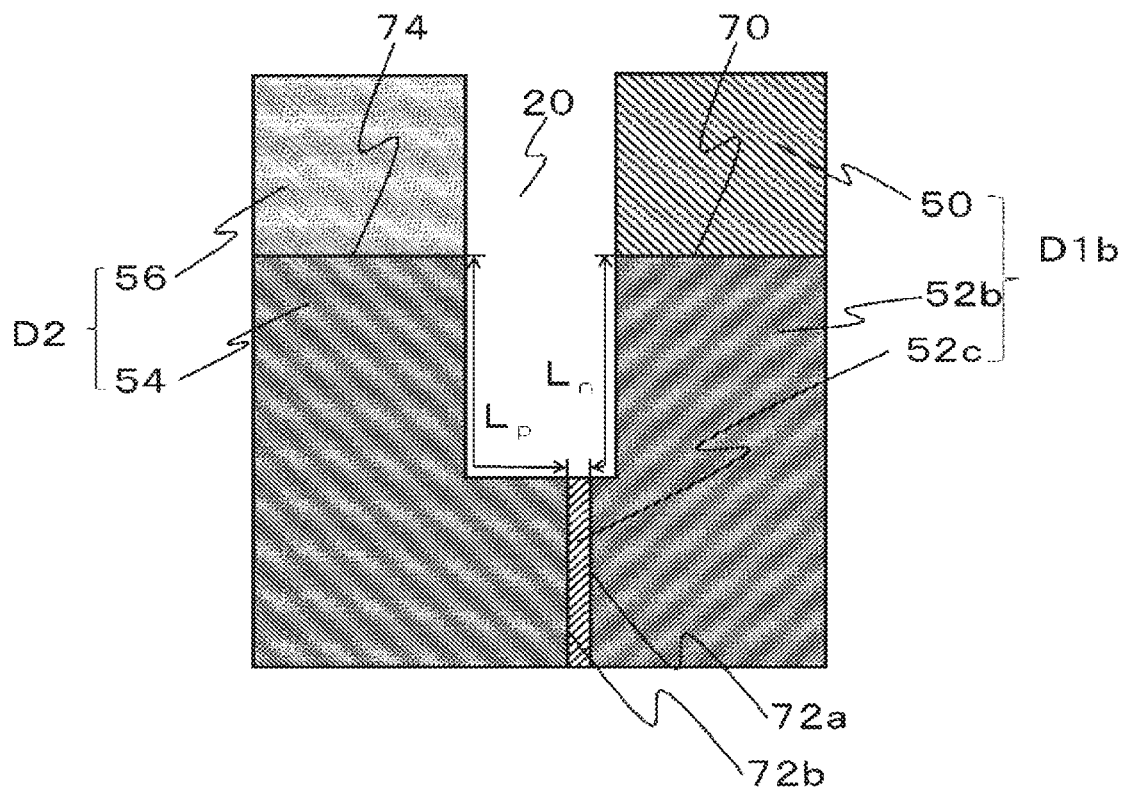
FIG. 11 is a plan view showing a configuration of a portion of an infrared detection element of an infrared solid state imaging device as a fifth embodiment of the present invention.

FIG. 11 is a plan view showing a configuration of a portion of the infrared detection element of the infrared solid state imaging device as the present embodiment, and is a plan view showing another configuration of PN junction diode group 10 in FIG. 2. As in the first embodiment, metal wires 30 and 32 provided on the regions are omitted and are not shown in FIG. 11.

As shown in FIG. 11, the infrared detection element included in the present embodiment includes PN junction diode D1b and PN junction diode D2 connected in series with each other. PN junction diode D1b includes P type region 50, an N type region 52b having a bent shape placed adjacent to P type region 50 at junction surface 70, and N type region 52c placed adjacent to N type region 52b at a junction surface 72a and having an impurity concentration higher than that of N type region 52b. PN junction diode D2 includes P type region 54 having a bent shape placed adjacent to N type region 52c of PN junction diode D1b at a junction surface 72b, and N type region 56 placed adjacent to P type region 54 at junction surface 74. Therefore, P type region 50, N type region 52b, N type region 52c, P type region 54, and N type region 56 are placed such that PN junction diode group 10 as a whole has a U shape, as in the first embodiment.

Accordingly, shortest length $L_n$ from junction surface 70 to junction surface 72a is the shortest length within N type region 52b. While the relation between shortest length $L_n$ from junction surface 70 to junction surface 72a within N type region 52b and shortest length $L_p$ from junction surface 72b to junction surface 74 within P type region 54 and the effect thereof are the same as those in the first embodiment and thus the description thereof is omitted, by providing N type region 52c having a high concentration between N type region 52b and P type region 54, holes injected from P type region 50 into N type region 52b can be recombined further efficiently within N type region 52c having a high concentration, and thus the holes injected from P type region 50 into N type region 52b are less likely to pass through junction surface 72b. Thus, an increase in the noise of the infrared detection element caused by the holes injected from P type region 50 into N type region 52b can be further suppressed.

Therefore, by the present embodiment configured as described above, an infrared solid state imaging device that further reduces noise when compared with the first embodiment can be provided.

Here, the configuration of the infrared detection element of the infrared solid state imaging device as the present embodiment is also applicable to other embodiments.

Sixth Embodiment

In an infrared detection element of an infrared solid state imaging device as a sixth embodiment, a P type region 54d having a high concentration is provided at a junction surface between PN junction diode D1 and a PN junction diode D2c, unlike the infrared detection element in the first embodiment. Since parts designated by the same reference numerals are configured in the same manner as those in the infrared detection element in the first embodiment, the description thereof is omitted.

Figure 12:
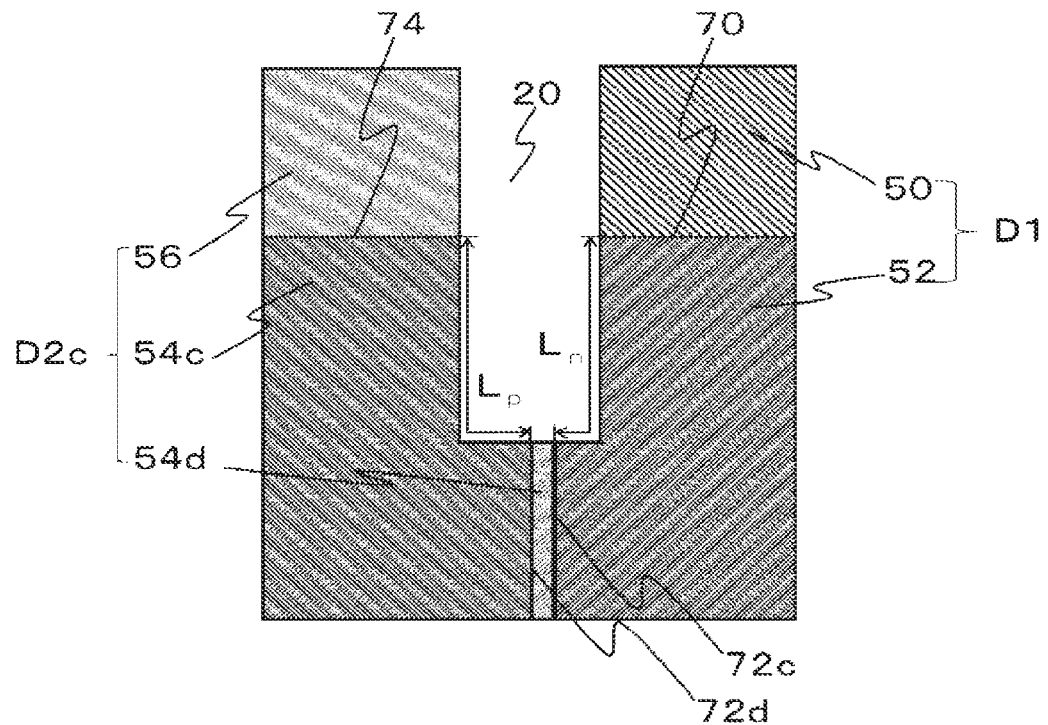
FIG. 12 is a plan view showing a configuration of a portion of an infrared detection element of an infrared solid state imaging device as a sixth embodiment of the present invention.

FIG. 12 is a plan view showing a configuration of a portion of the infrared detection element of the infrared solid state imaging device as the present embodiment, and is a plan view showing another configuration of PN junction diode group 10 in FIG. 2. As in the first embodiment, metal wires 30 and 32 provided on the regions are omitted and are not shown in FIG. 12.

As shown in FIG. 12, the infrared detection element included in the present embodiment includes PN junction diode D1 and PN junction diode D2c connected in series with each other. PN junction diode D1 includes P type region 50 and N type region 52 having a bent shape placed adjacent to P type region 50 at junction surface 70. PN junction diode D2c includes P type region 54d placed adjacent to N type region 52 of PN junction diode D1 at a junction surface 72c and having an impurity concentration higher than that of a P type region 54c, P type region 54c having a bent shape placed adjacent to P type region 54d at a junction surface 72d, and N type region 56 placed adjacent to P type region 54c at junction surface 74. Therefore, P type region 50, N type region 52, P type region 54d, P type region 54c, and N type region 56 are placed such that PN junction diode group 10 as a whole has a U shape, as in the first embodiment.

Accordingly, shortest length $L_p$ from junction surface 72d to junction surface 74 is the shortest length within P type region 54c. While the relation between shortest length $L_n$ from junction surface 70 to junction surface 72c within N type region 52 and shortest length $L_p$ from junction surface 72d to junction surface 74 within P type region 54c and the effect thereof are the same as those in the first embodiment and thus the description thereof is omitted, by providing P type region 54d having a high concentration between N type region 52 and P type region 54c, electrons injected from N type region 56 into P type region 54c can be recombined further efficiently within P type region 54d having a high concentration, and thus the electrons injected from N type region 56 into P type region 54c are less likely to pass through junction surface 72c. Thus, an increase in the noise of the infrared detection element caused by the electrons injected from N type region 56 into P type region 54c can be further suppressed.

Therefore, by the present embodiment configured as described above, an infrared solid state imaging device that further reduces noise when compared with the first embodiment can be provided.

Here, the configuration of the infrared detection element of the infrared solid state imaging device as the present embodiment is also applicable to other embodiments.

Seventh Embodiment

An infrared detection element of an infrared solid state imaging device as a seventh embodiment includes an N type region 56a having a high concentration formed in a self-aligning manner within a P type region 54e of a PN junction diode D2d, unlike the infrared detection element in the first embodiment. Since parts designated by the same reference numerals are configured in the same manner as those in the infrared detection element in the first embodiment, the description thereof is omitted.

Figure 13:
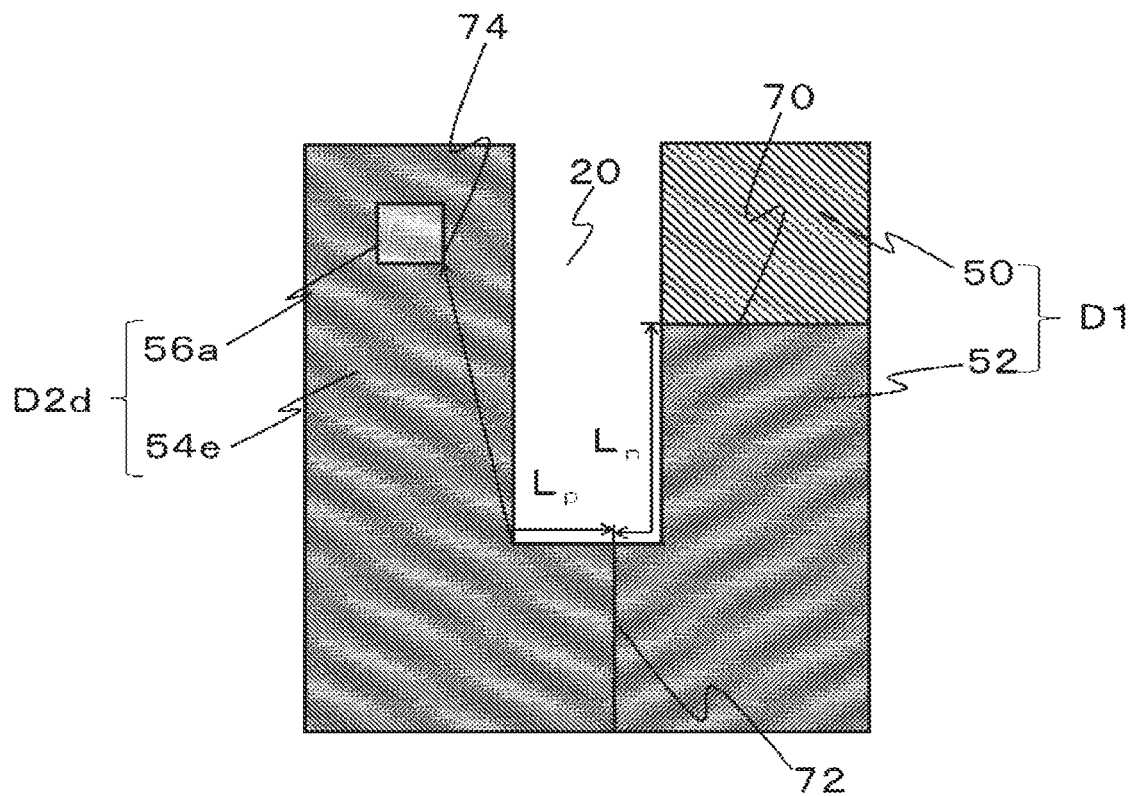
FIG. 13 is a plan view showing a configuration of a portion of an infrared detection element of an infrared solid state imaging device as a seventh embodiment of the present invention.

FIG. 13 is a plan view showing a configuration of a portion of the infrared detection element of the infrared solid state imaging device as the present embodiment, and is a plan view showing another configuration of PN junction diode group 10 in FIG. 2. As in the first embodiment, metal wires 30 and 32 provided on the regions are omitted and are not shown in FIG. 13.

As shown in FIG. 13, the infrared detection element included in the present embodiment includes PN junction diode D1 and PN junction diode D2d connected in series with each other. As in the first embodiment, PN junction diode D1 includes P type region 50 and N type region 52 having a bent shape placed adjacent to P type region 50 at junction surface 70. PN junction diode D2d includes P type region 54e having a bent shape placed adjacent to N type region 52 of PN junction diode D1 at junction surface 72, and N type region 56a formed in a self-aligning manner within P type region 54e and having an impurity concentration higher than that of P type region 54e. A boundary with P type region 54e that surrounds N type region 56a serves as junction surface 74.

Accordingly, since shortest length $L_p$ from junction surface 72 to junction surface 74 within P type region 54e is the length of a shortest path along which holes or electrons can pass through a region of attention when the holes or the electrons injected from a region adjacent on one side pass through the region of attention and reach a region adjacent on the other side, as described in the first embodiment, the length shown in FIG. 13 is shortest length $L_p$. Since the relation between shortest length $L_n$ from junction surface 70 to junction surface 72 within N type region 52 and shortest length $L_p$ from junction surface 72 to junction surface 74 within P type region 54e and the effect thereof are the same as those in the first embodiment, the details thereof are omitted.

Figure 14:
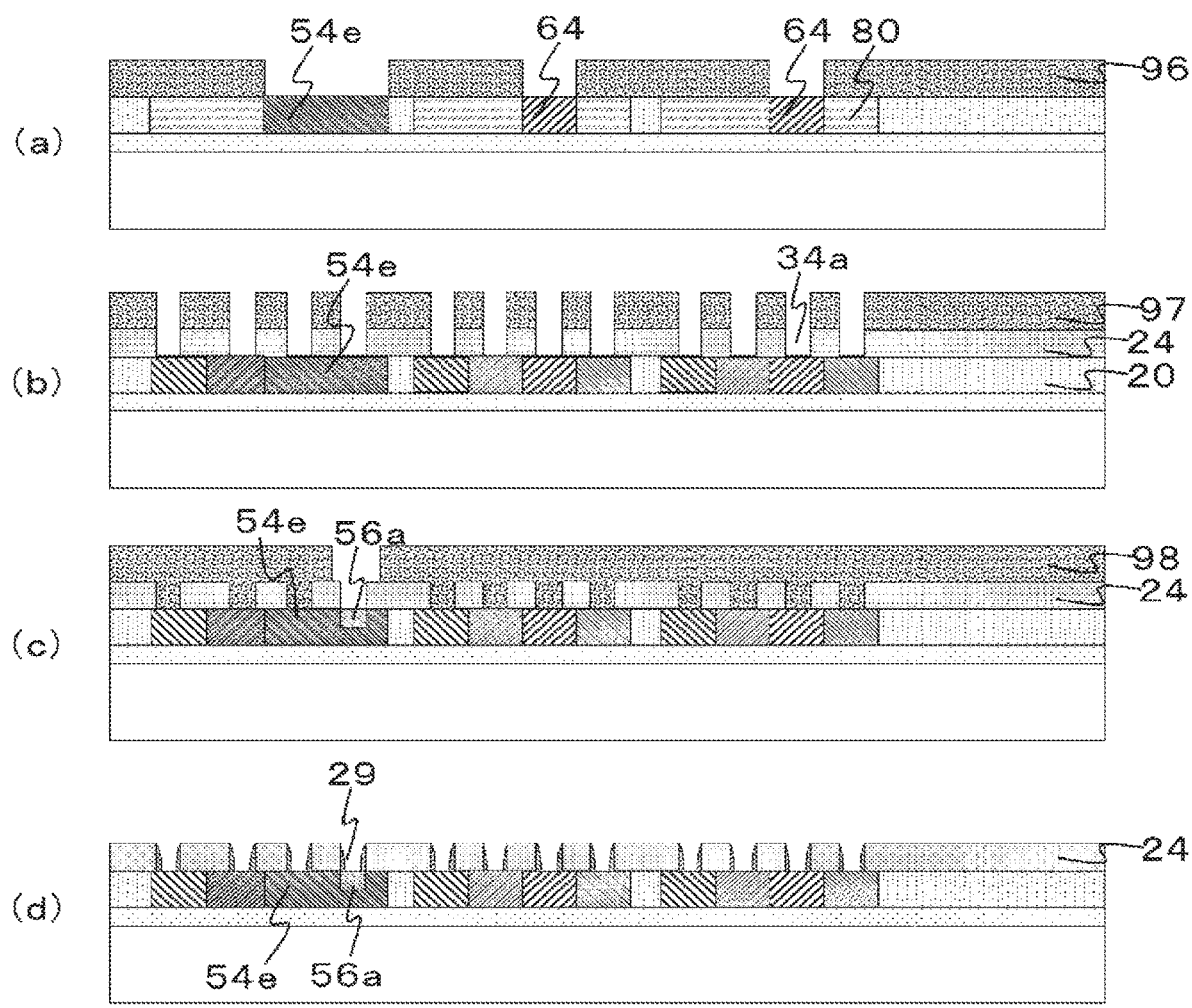
FIG. 14 is a cross sectional view showing the steps of forming respective conductivity type regions, of a method for manufacturing the infrared detection element of the infrared solid state imaging device as the seventh embodiment of the present invention.

Next, a method for manufacturing the infrared detection element of the infrared solid state imaging device as the present embodiment will be described. FIG. 14 is a cross sectional view showing the steps of forming the P type regions and the N type regions, of the method for manufacturing the infrared detection element of the infrared solid state imaging device as the present embodiment. Here, only the characterizing portion of the method for manufacturing the infrared element as the present embodiment will be described, and the description of the same portion as that of the manufacturing method in the first embodiment will be omitted.

After insulating film 20 in FIG. 5(a) is formed, as shown in FIG. 14(a), a photoresist pattern 96 is formed. Photoresist pattern 96 has openings at regions for forming P type region 54e of PN junction diode D2d and P type regions 64 of PN junction diodes D4. Thereafter, P type impurity ions are implanted into semiconductor layers 80 using an ion implantation method, by using photoresist pattern 96 as a mask, and thereby P type region 54e and P type regions 64 are formed. On this occasion, P type region 54e is formed in a region that also includes a region for forming N type region 56 of the first embodiment.

Then, after the steps of forming the regions shown in FIG. 5(c) and FIG. 5(e) other than N type region 56 of the first embodiment in FIG. 5(d) are performed, as shown in FIG. 14(b), insulating film 24 made of a silicon oxide film, for example, is formed on the regions of the PN junction diodes and insulating film 20, and a photoresist pattern 97 having openings is formed on insulating film 24 in order to form contact holes 34a in insulating film 24. Thereafter, insulating film 24 is removed by etching, until upper surfaces of the regions of the PN junction diodes are exposed, by using photoresist pattern 97 as a mask, and thereby contact holes 34a are formed. On this occasion, contact holes 34a are also formed on P type region 54e where N type region 56a is to be formed.

Then, as shown in FIG. 14(c), photoresist pattern 97 is removed, and thereafter, a photoresist pattern 98 having an opening at contact hole 34a on P type region 54e where N type region 56a is to be formed is formed. The opening in this photoresist pattern 98 is formed to be larger than the inner diameter of contact hole 34a. Thereafter, N type impurity ions are implanted into P type region 54e in a self-aligning manner, by using photoresist pattern 98 and insulating film 24 as masks, and thereby N type region 56a is formed. On this occasion, the N type impurity ions are implanted such that the impurity concentration of N type region 56a becomes higher than the impurity concentration of P type region 54e.

Then, as shown in FIG. 14(d), photoresist pattern 98 is removed, and thereafter, an insulating film 29 is formed on side walls of contact holes 34a. This can prevent a short circuit between metal wire 30 electrically connected to N type region 56a and adjacent P type region 54e.

Since the subsequent steps are the same as the step in FIG. 6(b) and the steps subsequent thereto, the description thereof is omitted.

Thus, the infrared detection element included in the present embodiment can be manufactured.

Since N type region 56a having a high concentration is formed in a self-aligning manner in the infrared detection element included in the present embodiment, contact resistance with metal wire 30 can be reduced, and the area of N type region 56a can be decreased when compared with the first embodiment. Accordingly, the infrared detection element included in the present embodiment can be downsized when compared with the first embodiment, and can miniaturize the infrared solid state imaging device as a whole.

Therefore, by the present embodiment configured as described above, an infrared solid state imaging device that reduces noise can be provided. In addition, the infrared detection element included in the present embodiment can be downsized when compared with the first embodiment, and can miniaturize the infrared solid state imaging device.

Here, the configuration of the infrared detection element of the infrared solid state imaging device as the present embodiment is also applicable to other embodiments.

Eighth Embodiment

An infrared detection element of an infrared solid state imaging device as an eighth embodiment includes a P type region 50a having a high concentration formed in a self-aligning manner within an N type region 52d of a PN junction diode D1c, unlike the infrared detection element in the first embodiment. Since parts designated by the same reference numerals are configured in the same manner as those in the infrared detection element in the first embodiment, the description thereof is omitted.

Figure 15:
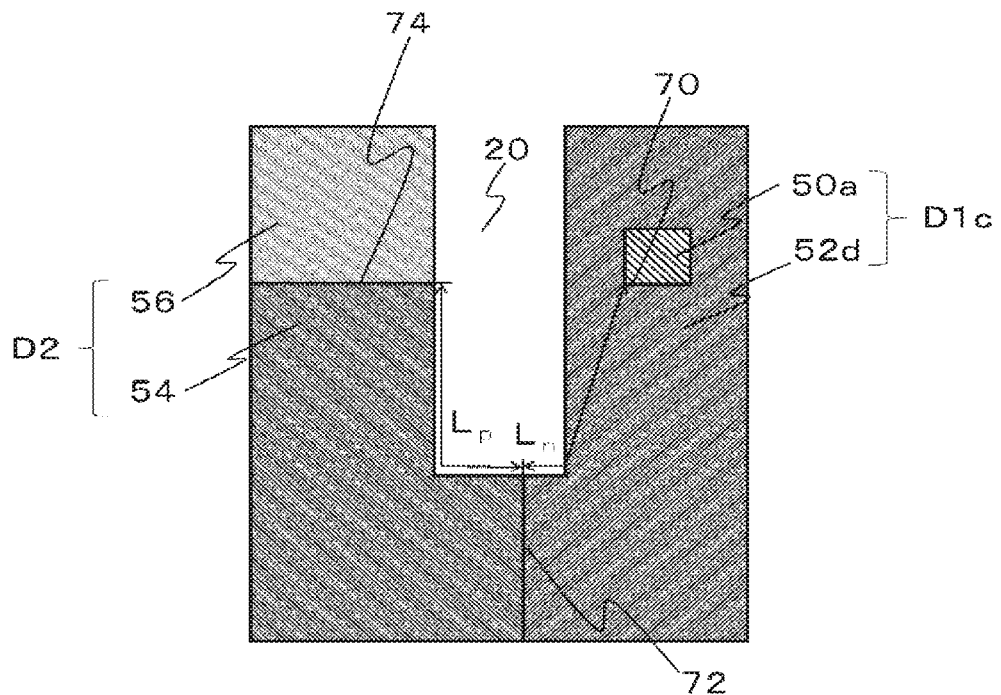
FIG. 15 is a plan view showing a configuration of a portion of an infrared detection element of an infrared solid state imaging device as an eighth embodiment of the present invention.

FIG. 15 is a plan view showing a configuration of a portion of the infrared detection element of the infrared solid state imaging device as the present embodiment, and is a plan view showing another configuration of PN junction diode group 10 in FIG. 2. As in the first embodiment, metal wires 30 and 32 provided on the regions are omitted and are not shown in FIG. 15.

As shown in FIG. 15, the infrared detection element included in the present embodiment includes PN junction diode D1c and PN junction diode D2 connected in series with each other. PN junction diode D1c includes N type region 52d having a bent shape, and P type region 50a formed in a self-aligning manner within N type region 52d and having an impurity concentration higher than that of N type region 52d. As in the first embodiment, PN junction diode D2 includes P type region 54 having a bent shape placed adjacent to N type region 52d of PN junction diode D1c at junction surface 72, and N type region 56 placed adjacent to P type region 54 at junction surface 74. A boundary with N type region 52d that surrounds P type region 50a serves as junction surface 70.

Accordingly, since shortest length $L_n$ from junction surface 70 to junction surface 72 within N type region 52d is the length of a shortest path along which holes or electrons can pass through each region when the holes or the electrons injected from a region adjacent on one side pass through each region and reach a region adjacent on the other side, as described in the first embodiment, the length shown in FIG. 15 is shortest length $L_n$. Since the relation between shortest length $L_n$ from junction surface 70 to junction surface 72 within N type region 52d and shortest length $L_p$ from junction surface 72 to junction surface 74 within P type region 54 and the effect thereof are the same as those in the first embodiment, the details thereof are omitted.

In addition, since the infrared detection element included in the present embodiment can be formed by the same method as the manufacturing method in the seventh embodiment, the description of the manufacturing method thereof is omitted.

Further, while the effect of the infrared solid state imaging device as the present embodiment is also the same as that in the seventh embodiment and thus the description thereof is omitted, by the present embodiment configured as described above, an infrared solid state imaging device that reduces noise can be provided. In addition, the infrared detection element included in the present embodiment can be downsized when compared with the first embodiment, and can miniaturize the infrared solid state imaging device.

Here, the configuration of the infrared detection element of the infrared solid state imaging device as the present embodiment is also applicable to other embodiments.

Ninth Embodiment

In an infrared detection element of an infrared solid state imaging device as a ninth embodiment, an impurity region 58 including an impurity for forming a deep level, such as a transition metal, is provided at a junction surface between a PN junction diode D1d and PN junction diode D2, unlike the infrared detection element in the first embodiment. Since parts designated by the same reference numerals are configured in the same manner as those in the infrared detection element in the first embodiment, the description thereof is omitted.

Figure 16:
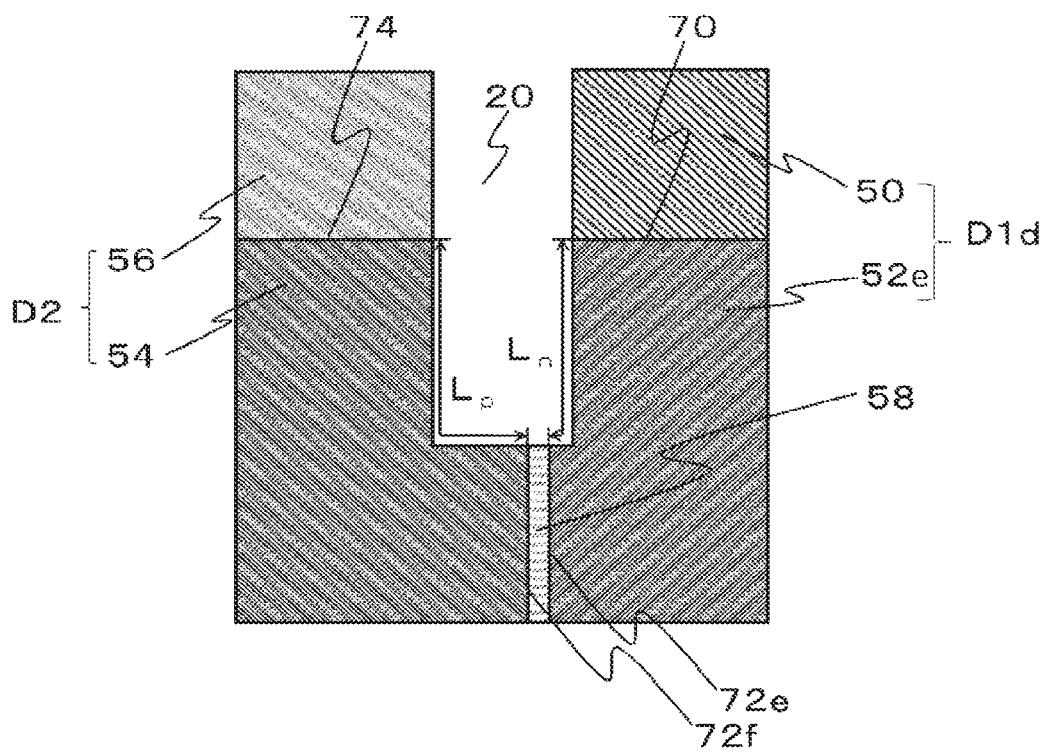
FIG. 16 is a plan view showing a configuration of a portion of an infrared detection element of an infrared solid state imaging device as a ninth embodiment of the present invention.

FIG. 16 is a plan view showing a configuration of a portion of the infrared detection element of the infrared solid state imaging device as the present embodiment, and is a plan view showing another configuration of PN junction diode group 10 in FIG. 2. As in the first embodiment, metal wires 30 and 32 provided on the regions are omitted and are not shown in FIG. 16.

As shown in FIG. 16, the infrared detection element included in the present embodiment includes PN junction diode D1d and PN junction diode D2 connected in series with each other. PN junction diode D1d includes P type region 50, an N type region 52e having a bent shape placed adjacent to P type region 50 at junction surface 70, and impurity region 58 placed adjacent to N type region 52e at a junction surface 72e and doped with an impurity for forming a deep level, such as a transition metal. PN junction diode D2 includes P type region 54 having a bent shape placed adjacent to impurity region 58 of PN junction diode D1d at a junction surface 72f, and N type region 56 placed adjacent to P type region 54 at junction surface 74. Therefore, P type region 50, N type region 52e, impurity region 58, P type region 54, and N type region 56 are placed such that PN junction diode group 10 as a whole has a U shape, as in the first embodiment.

Here, shortest length $L_n$ from junction surface 70 to junction surface 72e is the shortest length within N type region 52e. Since the relation between shortest length $L_n$ from junction surface 70 to junction surface 72e within N type region 52e and shortest length $L_p$ from junction surface 72f to junction surface 74 within P type region 54 and the effect thereof are the same as those in the first embodiment, the description thereof is omitted.

Impurity region 58 is a region doped with an impurity for forming a deep level, such as a transition metal, and the impurity concentration of the impurity for forming a deep level, such as a transition metal, is higher than the concentration within N type region 52e.

Accordingly, since a transition metal within impurity region 58 forms a deep level and acts as the center of recombination, holes injected from P type region 50 into N type region 52e can be efficiently recombined, and an increase in the noise of the infrared detection element caused by these holes can be further suppressed.

Therefore, by the present embodiment configured as described above, an infrared solid state imaging device that further reduces noise when compared with the first embodiment can be provided.

Although the present embodiment herein describes, as an example, impurity region 58 in which the impurity concentration of the impurity for forming a deep level, such as a transition metal, is higher than the concentration within N type region 52e, an impurity region may be provided on a P type region 54 side of junction surface 72, and the concentration of an impurity for forming a deep level, such as a transition metal, may be higher than the concentration within P type region 54. Further, both may be used in combination.

Here, the configuration of the infrared detection element of the infrared solid state imaging device as the present embodiment is also applicable to other embodiments.

As have been described above, the embodiments of the present invention have described that the regions are placed such that PN junction diode group 10 as a whole has a U shape, an L shape, or a crank shape. However, PN junction diode group 10 as a whole does not have to have a U shape, an L shape, or a crank shape, as long as the relation between shortest length $L_n$ from junction surface 70 to junction surface 72 within the N type region and shortest length $L_p$ from junction surface 72 to junction surface 74 within the P type region has a relation as described above. The regions may be linearly placed, and the shape of PN junction diode group 10 can be changed as appropriate within a scope that does not depart from the gist of the embodiments of the present invention. Similarly, the shapes of the regions constituting a PN junction diode can be changed as appropriate within a scope that does not depart from the gist of the embodiments of the present invention, as long as the relation between shortest length $L_n$ from junction surface 70 to junction surface 72 within the N type region and shortest length $L_p$ from junction surface 72 to junction surface 74 within the P type region has a relation as described in the above embodiments.

In addition, although the embodiments of the present invention have described, as an example, the infrared solid state imaging device in which the plurality of infrared detection elements are arranged as pixels in an array, an infrared detection device in which a single infrared detection element detects infrared rays may be provided.

It should be noted that the embodiments of the present invention can be freely combined, or can be changed or omitted as appropriate, within the scope of the invention. Further, the present invention is not limited to the embodiments described above, and can be changed in various manners in an implementation phase within a scope that does not depart from the gist thereof. In addition, the embodiments described above include the invention in various stages, and various inventions can be extracted by appropriately combining a plurality of disclosed constituent features.

REFERENCE SIGNS LIST

10, 12: PN junction diode group; 20, 22, 24, 26: insulating film; 30, 32: metal wire; 50, 54, 60, 64: P type region; 52, 56, 62, 66: N type region; 70, 72, 74: junction surface; D1, D2, D3, D4: PN junction diode.

The invention claimed is:

1. An infrared solid state imaging device comprising a first PN junction diode and a second PN junction diode connected in series that are provided to be thermally isolated from a substrate, the first PN junction diode and the second PN junction diode converting a temperature change caused by heat converted from emitted infrared rays into an electrical signal, wherein the infrared solid state imaging device comprises:
a first region having a first conductivity type;
a second region having a second conductivity type which constitutes the first PN junction diode together with the first region, which is in contact with the first region at a first junction surface, and which has a first shortest length that is a shortest length from the first junction surface to a second junction surface;
a third region having the first conductivity type which is in contact with the second region at the second junction surface, and which has a second shortest length that is a shortest length from the second junction surface to a third junction surface, the second shortest length being longer than the first shortest length;
a fourth region having the second conductivity type which constitutes the second PN junction diode together with the third region, and which is in contact with the third region at the third junction surface;
an element isolation region which establishes electrical isolation between the first region and the fourth region, between the first region and the third region, and between the second region and the fourth region; and
a metal wire provided on the second region and the third region for electrically connecting the first PN junction diode and the second PN junction diode in series,
wherein at least one of the second region and the third region has a bent shape in plan view,
wherein the first conductivity type is P type and the second conductivity type is N type,
wherein at least one of the first shortest length and the second shortest length includes the bent shape in a path, and
wherein the first shortest length and the second shortest length satisfy the following relation:

$$\frac{L_p}{L_n} = \sqrt{\frac{\mu_e \tau_e}{\mu_h \tau_h}}$$

where $L_n$ is the first shortest length, $L_p$ is the second shortest length, $\mu_e$ is mobility of electrons in the third region having the first conductivity type, $\tau_e$ is a time constant of recombination of the electrons, $\mu_h$ is mobility of holes in the second region having the second conductivity type, and $\tau_{eh}$ is a time constant of recombination of the holes.

2. The infrared solid state imaging device according claim 1, wherein the first region, the second region, the third region, and the fourth region are placed such that the first PN junction diode and the second PN junction diode, as a whole, have a U shape in plan view.

3. The infrared solid state imaging device according to claim 1, wherein the first region, the second region, the third region, and the fourth region are placed such that the first PN junction diode and the second PN junction diode, as a whole, have an L shape in plan view.

4. The infrared solid state imaging device according to claim 1, wherein the second region and the third region are provided such that at least a portion of a line segment that connects an arbitrary point on the first junction surface and an arbitrary point on the third junction surface is within the element isolation region.

5. The infrared solid state imaging device according to claim 1, wherein the infrared solid state imaging device has a fifth region having the second conductivity type which has an impurity concentration higher than that of the second region, between the second region and the third region.

6. The infrared solid state imaging device according to claim 1, wherein the infrared solid state imaging device has a sixth region having the first conductivity type which has an impurity concentration higher than that of the third region, between the second region and the third region.

7. The infrared solid state imaging device according to claim 1, wherein the first region has an impurity concentration higher than that of the second region, and is partially provided within the second region.

8. The infrared solid state imaging device according to claim 1, wherein the fourth region has an impurity concentration higher than that of the third region, and is partially provided within the third region.

9. The infrared solid state imaging device according to claim 1, wherein the infrared solid state imaging device has a region having a transition metal concentration higher than that of the second region or the third region, between the second region and the third region.

\* \* \* \* \*